(12) United States Patent
Hogyoku et al.

(10) Patent No.: US 10,763,286 B2
(45) Date of Patent: Sep. 1, 2020

(54) SEMICONDUCTOR DEVICE, MANUFACTURING METHOD THEREOF, AND ELECTRONIC APPARATUS

(71) Applicant: SONY CORPORATION, Tokyo (JP)

(72) Inventors: Susumu Hogyoku, Kanagawa (JP); Shun Mitarai, Kanagawa (JP); Shusaku Yanagawa, Kanagawa (JP)

(73) Assignee: Sony Corporation, Tokyo (JP)

(*) Notice: Subject to any disclaimer, the term of this patent is extended or adjusted under 35 U.S.C. 154(b) by 86 days.

(21) Appl. No.: 15/745,176

(22) PCT Filed: Jul. 8, 2016

(86) PCT No.: PCT/JP2016/070262
§ 371 (c)(1),
(2) Date: Jan. 16, 2018

(87) PCT Pub. No.: WO2017/014072
PCT Pub. Date: Jan. 26, 2017

(65) Prior Publication Data
US 2018/0211989 A1    Jul. 26, 2018

(30) Foreign Application Priority Data
Jul. 23, 2015  (JP) .................. 2015-145944

(51) Int. Cl.
*H01L 27/146* (2006.01)
*H01L 27/14* (2006.01)
(Continued)

(52) U.S. Cl.
CPC ........ *H01L 27/14618* (2013.01); *G02B 7/021* (2013.01); *G02B 7/09* (2013.01);
(Continued)

(58) Field of Classification Search
CPC ............... H01L 27/14618; H01L 27/14; H01L 27/14623; H01L 27/14627;
(Continued)

(56) References Cited

U.S. PATENT DOCUMENTS 9,172,408 B2 * 10/2015 Chang .................. H04B 1/0483
9,899,442 B2 *  2/2018 Katkar ................ H01L 27/1464
(Continued)

FOREIGN PATENT DOCUMENTS

JP    2008-130738    6/2008
JP    2008-311423    12/2008
(Continued)

OTHER PUBLICATIONS

International Search Report prepared by the Japan Patent Office dated Jul. 8, 2016, for International Application No. PCT/JP2016/070262.

*Primary Examiner* — Fernando L Toledo
*Assistant Examiner* — Neil R Prasad
(74) *Attorney, Agent, or Firm* — Sheridan Ross P.C.

(57) ABSTRACT

The present technology relates to a semiconductor device providing an image sensor package capable of coping with an increase in the number of I/Os of an image sensor, a manufacturing method thereof, and an electronic apparatus. The semiconductor device includes an image sensor, a glass substrate, a wiring layer, and external terminals. In the image sensor, photoelectric conversion elements are formed on a semiconductor substrate. The glass substrate is arranged on a first main surface side of the image sensor. The wiring layer is formed on a second main surface side opposite to the first main surface. Each of the external terminals outputs a signal of the image sensor. Metal wiring of the wiring layer extends to an outer peripheral portion of the image sensor and is connected to the external terminals. The present
(Continued)

technology can be applied to, for example, an image sensor package and the like.

16 Claims, 37 Drawing Sheets

(51) Int. Cl.
*H01L 23/00* (2006.01)
*H04N 5/225* (2006.01)
*G02B 7/02* (2006.01)
*H04N 5/335* (2011.01)
*G02B 7/09* (2006.01)
*G03B 13/36* (2006.01)

(52) U.S. Cl.
CPC .............. *H01L 24/14* (2013.01); *H01L 24/17* (2013.01); *H01L 24/18* (2013.01); *H01L 24/19* (2013.01); *H01L 24/73* (2013.01); *H01L 24/92* (2013.01); *H01L 24/97* (2013.01); *H01L 27/14* (2013.01); *H01L 27/14623* (2013.01); *H01L 27/14627* (2013.01); *H01L 27/14636* (2013.01); *H01L 27/14645* (2013.01); *H01L 27/14683* (2013.01); *H04N 5/2254* (2013.01); *H04N 5/2257* (2013.01); *H04N 5/335* (2013.01); *G03B 13/36* (2013.01); *H01L 24/13* (2013.01); *H01L 24/16* (2013.01); *H01L 24/81* (2013.01); *H01L 24/83* (2013.01); *H01L 24/96* (2013.01); *H01L 2224/131* (2013.01); *H01L 2224/14135* (2013.01); *H01L 2224/14181* (2013.01); *H01L 2224/16225* (2013.01); *H01L 2224/73204* (2013.01); *H01L 2224/73259* (2013.01); *H01L 2224/73267* (2013.01); *H01L 2224/81191* (2013.01); *H01L 2224/81951* (2013.01); *H01L 2224/83192* (2013.01); *H01L 2224/92224* (2013.01); *H01L 2224/92244* (2013.01); *H01L 2224/95001* (2013.01); *H01L 2224/97* (2013.01); *H01L 2924/15151* (2013.01); *H01L 2924/15311* (2013.01); *H01L 2924/15321* (2013.01); *H01L 2924/16195* (2013.01)

(58) Field of Classification Search
CPC ......... H01L 27/14636; H01L 27/14645; H01L 27/14683; H01L 24/96; H01L 2224/16225; H01L 2224/95001; H01L 2224/97; H04N 5/2254; H04N 5/2257; H04N 5/335; G02B 7/09; G03B 13/36
See application file for complete search history.

(56) References Cited

U.S. PATENT DOCUMENTS

| | | | |
|---|---|---|---|
| 2009/0250803 | A1 | 10/2009 | Arai |
| 2011/0291215 | A1* | 12/2011 | Tu ..................... H01L 27/14618 257/433 |
| 2013/0194464 | A1 | 8/2013 | Suzuki et al. |
| 2015/0190040 | A1 | 7/2015 | Igarashi et al. |
| 2015/0325611 | A1* | 11/2015 | Jun ................... H01L 27/14618 257/434 |
| 2016/0126153 | A1* | 5/2016 | Minegishi ......... H01L 27/14618 257/701 |
| 2016/0163884 | A1* | 6/2016 | Sorrieul ............... H01L 31/186 257/434 |

FOREIGN PATENT DOCUMENTS

| | | |
|---|---|---|
| JP | 2009-252859 | 10/2009 |
| JP | 4664372 | 4/2011 |
| JP | 4693827 | 6/2011 |
| JP | 2013-041878 | 2/2013 |
| JP | 2014-067743 | 4/2014 |

* cited by examiner

SEMICONDUCTOR DEVICE, MANUFACTURING METHOD THEREOF, AND ELECTRONIC APPARATUS

CROSS REFERENCE TO RELATED APPLICATIONS

This application is a national stage application under 35 U.S.C. 371 and claims the benefit of PCT Application No. PCT/JP2016/070262 having an international filing date of 8 Jul. 2016, which designated the United States, which PCT application claimed the benefit of Japan Patent Application No. 2015-145944 filed 23 Jul. 2015, the disclosure of each of which are incorporated herein by reference.

TECHNICAL FIELD

The present technology relates to a semiconductor device, a manufacturing method thereof, and an electronic apparatus, and more particularly to a semiconductor device which makes it possible to provide an image sensor package capable of coping with an increase in the number of I/Os of an image sensor, a manufacturing method thereof, and an electronic apparatus.

BACKGROUND ART

By attaching a lens structure to an imaging element such as a CCD or CMOS image sensor to which a semiconductor microfabrication technology is applied, the imaging element is mounted as a camera module on an electronic apparatus such as a digital camera or a cellular phone. An image sensor package has been proposed which includes an image sensor chip (semiconductor element) mounted on a glass substrate in order to reduce the size and weight of the camera module.

For example, in Patent Document 1, a front-illuminated CMOS image sensor package is proposed in which metal bumps for performing electrical input/output (I/O) are formed on an outer edge of a light-receiving unit located on a sensor chip surface (light-receiving surface side), and a singulated sensor chip is flip-chip mounted so that a light-receiving surface thereof faces a glass substrate.

In addition, Patent Document 2 discloses a chip size package (CSP) of a front-illuminated CMOS image sensor. Regarding the image sensor CSP, first, a glass substrate wafer and a semiconductor substrate wafer on which a sensor is formed are subjected to wafer-to-wafer bonding via an adhesive layer so as to sandwich a sensor light-receiving unit. Then, after thinning and wiring formation, singulation is performed, and thereby the image sensor CSP is completed.

CITATION LIST

Patent Document

Patent Document 1: Japanese Patent No. 4664372
Patent Document 2: Japanese Patent No. 4693827

SUMMARY OF THE INVENTION

Problems to be Solved by the Invention

However, in the image sensor package disclosed in Patent Document 1, since it is necessary to form the metal bumps for performing electrical input and output at the outer edge of the light-receiving unit, the number of I/Os (the number of inputs/outputs) is limited and a chip area increases.

In addition, in the image sensor CSP disclosed in Patent Document 2, the package size after singulation is the same as the chip size of the image sensor. Metal bumps and the like which perform electrical input and output are required to be arranged on a back surface of the sensor chip, but the number of I/Os which can be arranged on the back surface of the sensor chip is largely restricted by the structure.

The present technology has been made in view of such a situation, and is intended to provide an image sensor package capable of coping with an increase in the number of I/Os of an image sensor.

Solutions to Problems

A semiconductor device according to a first aspect of the present technology includes an image sensor in which photoelectric conversion elements are formed on a semiconductor substrate, a glass substrate arranged on a first main surface side of the image sensor, a first wiring layer formed on a second main surface side opposite to the first main surface of the image sensor, and external terminals each of which outputs a signal of the image sensor to outside, and in the semiconductor device, metal wiring of the first wiring layer is formed so as to extend from inside to an outer peripheral portion of the image sensor and is connected to each of the external terminals.

A method for manufacturing a semiconductor device according to the first aspect of the present technology includes arranging a glass substrate on a first main surface side of an image sensor in which photoelectric conversion elements are formed on a semiconductor substrate, forming a wiring layer which includes metal wiring extending from inside to an outer peripheral portion of the image sensor on a second main surface side opposite to the first main surface of the image sensor, and forming the external terminals to be connected to the metal wiring.

An electronic apparatus according to the first aspect of the present technology includes a semiconductor device which includes an image sensor in which photoelectric conversion elements are formed on a semiconductor substrate, a glass substrate arranged on a first main surface side of the image sensor, a wiring layer formed on a second main surface side opposite to the first main surface of the image sensor, and external terminals each of which outputs a signal of the image sensor to outside, in which metal wiring of the wiring layer is formed so as to extend from inside to an outer peripheral portion of the image sensor and is connected to each of the external terminals.

In the first aspect of the present technology, a glass substrate is arranged on a first main surface side of an image sensor in which photoelectric conversion elements are formed on a semiconductor substrate, a wiring layer which includes metal wiring extending from inside to an outer peripheral portion of the image sensor is formed on a second main surface side opposite to the first main surface of the image sensor, and the external terminals are connected to the metal wiring.

A semiconductor device according to a second aspect of the present technology includes an image sensor in which photoelectric conversion elements are formed on a semiconductor substrate, a glass substrate which protects a first main surface which is a light-receiving surface of the image sensor, and an insulating member which covers side surfaces of the image sensor and the glass substrate.

In the semiconductor device according to the second aspect of the present technology, an image sensor in which photoelectric conversion elements are formed on a semiconductor substrate, a glass substrate which protects a first main surface which is a light-receiving surface of the image sensor, and an insulating member which covers side surfaces of the image sensor and the glass substrate are provided.

The semiconductor device and the electronic apparatus may be independent devices or may be modules to be incorporated into other devices.

Effects of the Invention

According to the first and second aspects of the present technology, it is possible to provide an image sensor package capable of coping with an increase in the number of I/Os of an image sensor.

Note that the effects described herein are not necessarily limited, and may be any of the effects described in the present disclosure.

MODE FOR CARRYING OUT THE INVENTION

Hereinafter, modes for carrying out the present technology (hereinafter referred to as embodiments) will be described. Note that the description will be given in the following order.

1. First Embodiment of Image Sensor Package
2. Second Embodiment of Image Sensor Package
3. Third embodiment of Image Sensor Package
4. Fourth Embodiment of Image Sensor Package
5. Fifth Embodiment of Image Sensor Package
6. Sixth Embodiment of Image Sensor Package
7. Seventh Embodiment of Image Sensor Package
8. Eighth Embodiment of Image Sensor Package
9. Configuration Example of Multi-Chip Module
10. Configuration Example of Camera Module
11. Configuration Examples of Multi-Ocular Camera Module
12. Examples of Application to Electronic Apparatus

1. First Embodiment

<1.1 Structural Views of First Embodiment>

Figure 1:
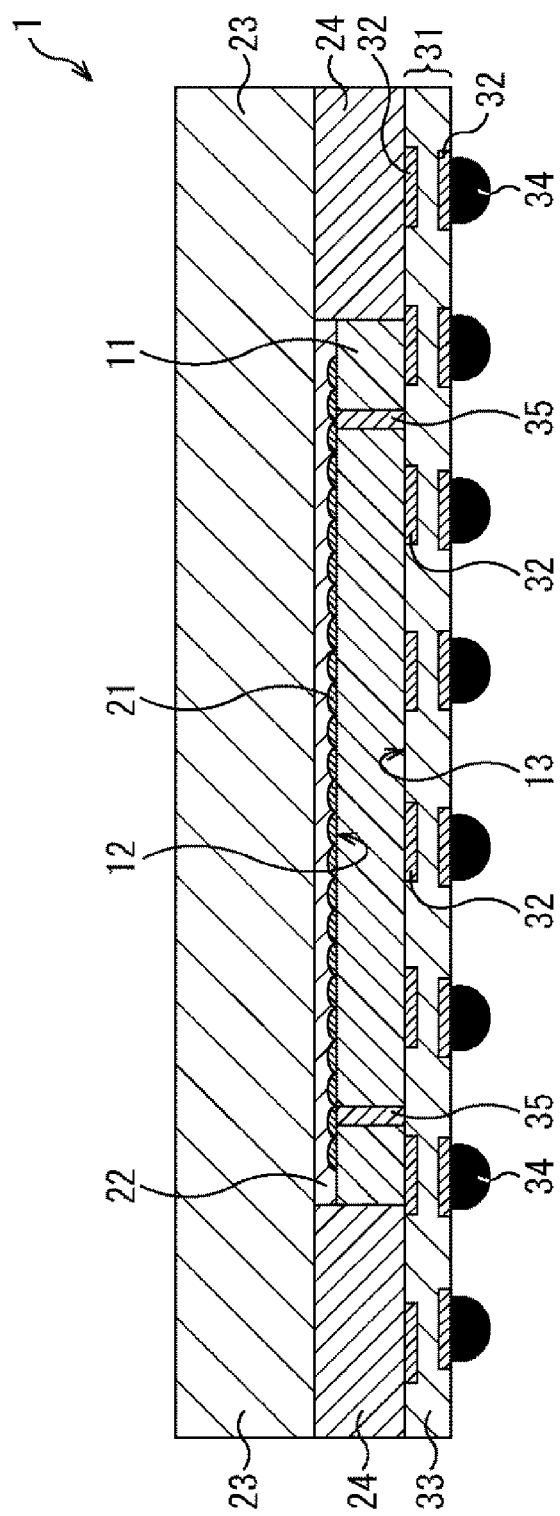
FIG. 1 is a cross-sectional view of an image sensor package as a first embodiment of a semiconductor device to which the present technology is applied.

FIG. 1 illustrates a cross-sectional view of an image sensor package as a first embodiment of a semiconductor device to which the present technology is applied.

The image sensor package 1 of FIG. 1 includes an image sensor 11 in which semiconductor elements such as photodiodes (photoelectric conversion elements) and transistors are formed on a semiconductor substrate (not illustrated) such as a silicon substrate. The image sensor 11 is, for example, a back-illuminated complementary metal oxide semiconductor (CMOS) image sensor or the like.

In FIG. 1, on-chip lenses 21 are formed on a side of a first main surface 12 which is a light incident surface side of the image sensor 11. Above the on-chip lenses 21, a light transmissive member 22 having a high visible light transmittance is arranged, and a glass substrate 23 is arranged via the light transmissive member 22. For the light transmissive member 22, a material whose refractive index is, for example, about 0.5 to 3.0 can be used, but the refractive index is more preferably close to the refractive index of the glass substrate 23.

The light transmissive member 22 and the glass substrate 23 can protect a light-receiving unit of the image sensor 11 from grit, dust, and the like. Here, the light-receiving unit of the image sensor 11 is a portion where light enters (passes), for example, a photodiode, a color filter, an on-chip lens, or the like.

A covering portion 24 is arranged on side surfaces of the image sensor 11, and the glass substrate 23 is arranged above the covering portion 24 and the image sensor 11. The covering portion 24 can be formed, for example, of a resin material having a light-blocking property with a transmittance of light ranging from visible light to near infrared light of 10% or less (hereinafter simply referred to as a light-blocking material). Alternatively, the covering portion 24 can include a resin material having a high thermal conductivity with a thermal conductivity of 0.5 W/m·K or more (hereinafter referred to as a heat-dissipating material).

A film (not illustrated) such as an acrylic film for preventing a rays generated from the glass substrate 23 from entering the light-receiving unit of the image sensor 11, an infrared cut filter (not illustrated) for removing an infrared component of incident light, an optical film (not illustrated) for preventing reflection of incident light, and the like may be formed on the glass substrate 23.

A re-distribution layer (RDL) 31 is formed on a side of a second main surface 13 which is a lower side of the image sensor 11. The re-distribution layer 31 is also formed so as to correspond to a planar region including the covering portion 24 and the image sensor 11. The second main surface 13 of the image sensor 11 and the surface of the covering portion 24 are flat surfaces, so that the re-distribution layer 31 is easily formed.

Note that in the following description, the side of the second main surface 13, which is the lower side of the image sensor 11, is also referred to as a rear surface of the image sensor 11.

The re-distribution layer 31 includes a plurality of metal wiring layers 32 and an insulating layer 33 formed between the metal wiring layers 32. The metal wiring layers 32 are connected to each other by through holes (not illustrated) formed in the insulating layer 33. Among the plurality of metal wiring layers 32, the lowermost metal wiring layers 32 are connected to external terminals 34. The external terminals 34 are each a terminal for receiving input or output of an electric signal or receiving supply of power, and constituted by, for example, a metal bump.

Charges, which have been generated by the photodiode of the image sensor 11 receiving light, are each transmitted from an internal circuit formed in the semiconductor substrate to the metal wiring layer 32 via a through silicon via (TSV) 35, and output as an electric signal from the external terminal 34.

As will be described later with reference to FIG. 29, the image sensor package 1 is assembled together with a lens structure 173 and the like to constitute a camera module 151.

Figure 2:
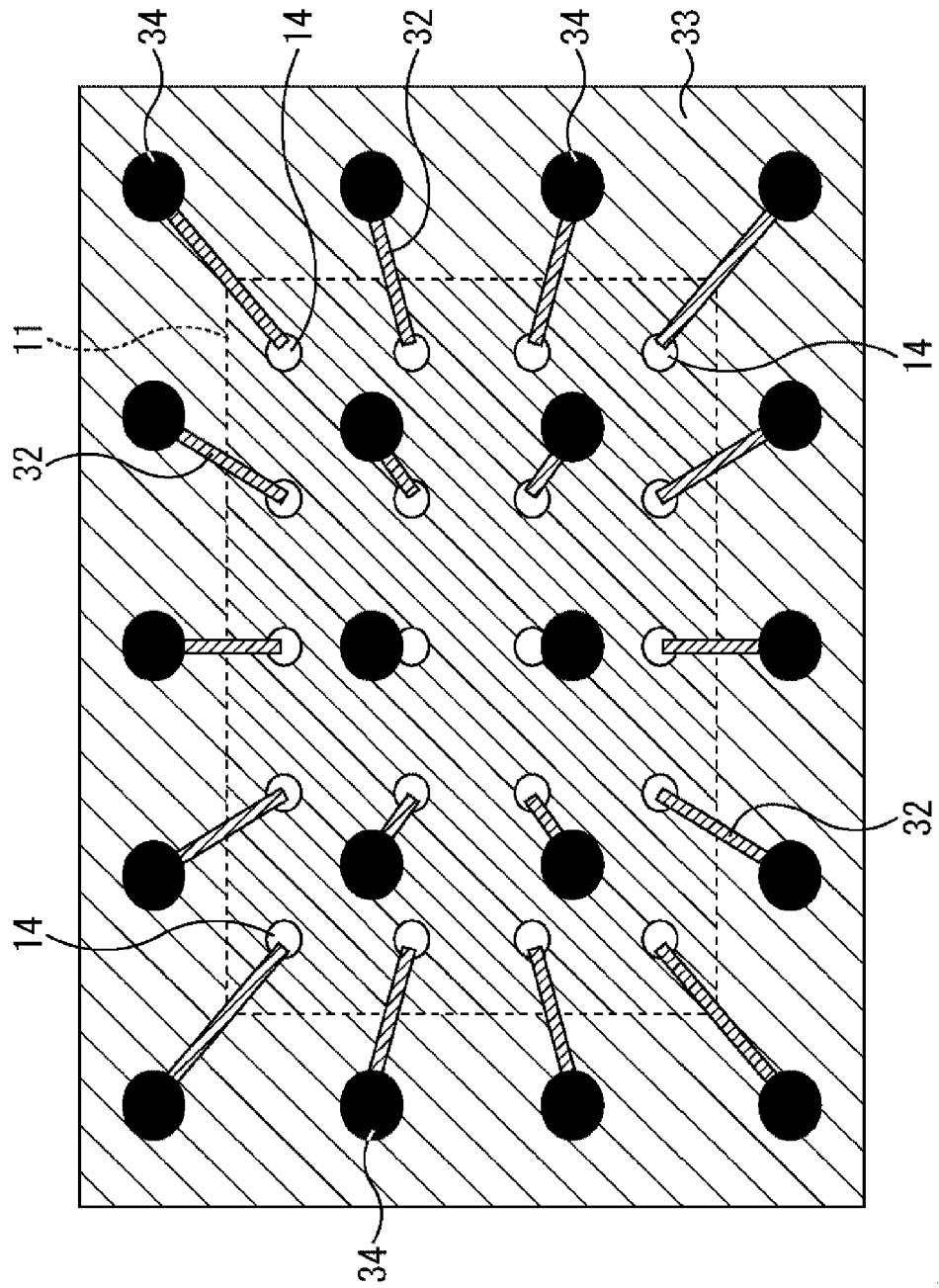
FIG. 2 is a plan view of the image sensor package of FIG. 1.

FIG. 2 is a plan view of the image sensor package 1 of FIG. 1 as viewed from a side of the external terminals 34.

As illustrated in FIG. 2, each of the metal wiring layers 32 as the lowermost layer in FIG. 1 is formed so as to extend from an electrode unit 14 formed in a region of the image sensor 11 to an outer peripheral portion, and is connected to the external terminal 34 of the image sensor package 1. By connecting the metal wiring layers 32 to the external terminals 34 as fan-out wiring extending to the outer peripheral portion as described above, the external terminals 34 can be arranged in a region including the planar region of the covering portion 24 and larger than the planar region of the image sensor 11.

Consequently, according to the image sensor package 1 of the first embodiment, it is possible to cope with an increase in the number of I/Os of the image sensor 11, i.e. to provide more external terminals 34.

In addition, since the side surfaces of the image sensor 11 are covered with the covering portion 24, the side surfaces of the image sensor 11 can be protected.

<1.2 Manufacturing Method of First Embodiment>

Next, a manufacturing method (first manufacturing method) of the image sensor package 1 of the first embodiment will be described with reference to FIG. 3.

First, the image sensors 11 singulated from a semiconductor wafer are prepared. Then, as illustrated in A of FIG. 3, the singulated image sensors 11 are mounted on the glass substrate 23. Specifically, the light transmissive members 22 are formed on the glass substrate 23, for example, by coating, and the singulated image sensors 11 are aligned on and adhered to the light transmissive members 22 in a pick-and-place manner so that light-receiving surfaces thereof face the glass substrate 23.

The glass substrate 23 is constituted by, for example, borosilicate glass, quartz glass, soda lime glass, or the like, in a form of a wafer or a panel.

Figure 3:
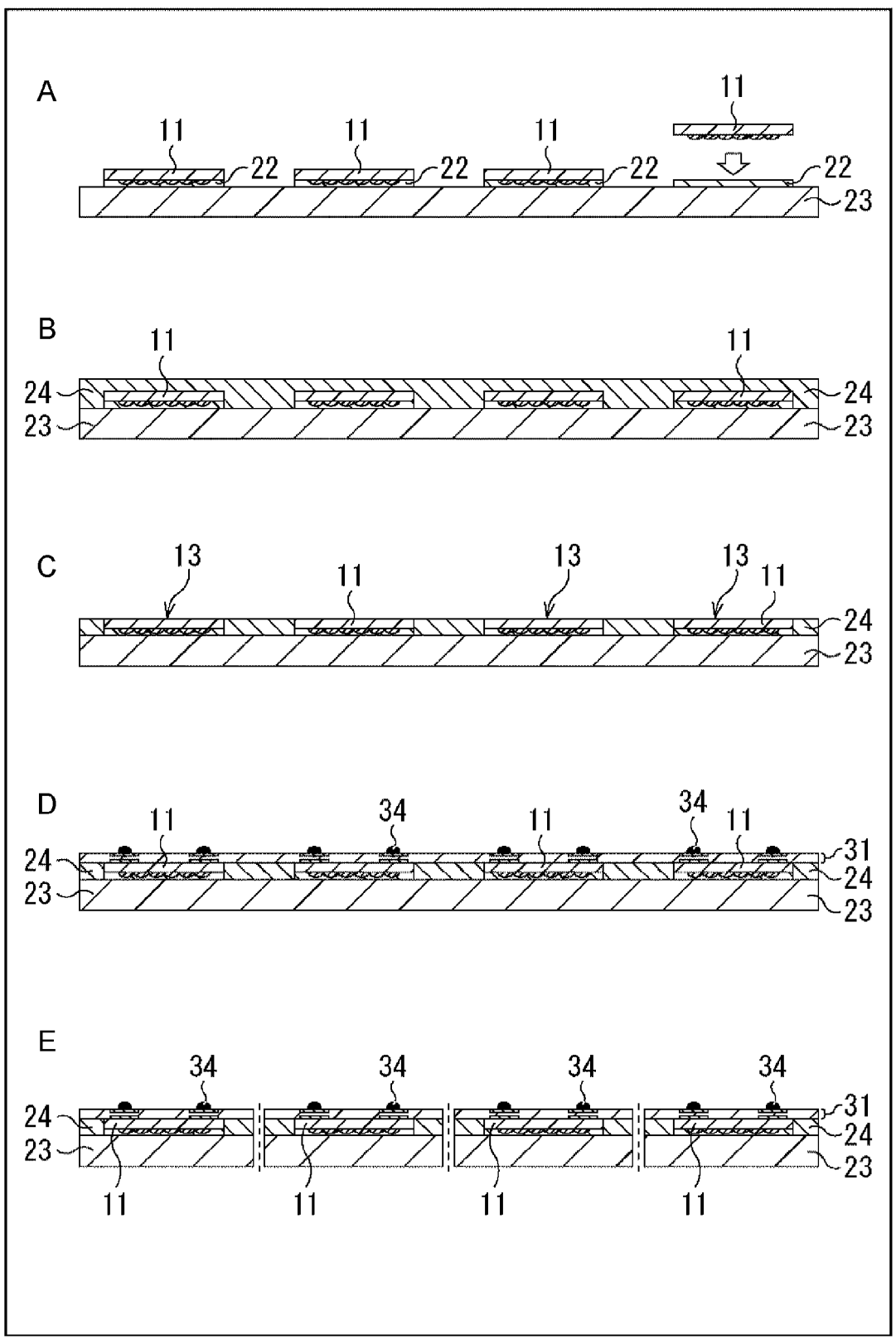
FIG. 3 is a set of views explaining a method for manufacturing the image sensor package of the first embodiment.

Next, as illustrated in B of FIG. 3, a surface of the glass substrate 23 on which the image sensors 11 are mounted is covered (molded) with a predetermined covering material by a printing method, a coating method, a lamination method, a molding method, or the like, and thereby the covering portion 24 is formed. As the covering material, for example, an insulating material such as a general epoxy-type molding material for semiconductor packaging applications can be used.

Subsequently, as illustrated in C of FIG. 3, the second main surface 13 of each image sensor 11 is exposed by grinding the surface of the covering portion 24 thus formed by mechanical grinding, chemical mechanical polishing (CMP), or the like. The grinding may also serve to reduce the thickness of the image sensors 11.

Since there is no device circuit on the second main surface 13 of each image sensor 11, the grinding precision does not need to be very high. By performing grinding, the covering portion 24 and the second main surface 13 of each image sensor 11 can be flattened, and the TSVs 35 (not illustrated in FIG. 3) can be uniformly exposed. Thus, the connection between the TSVs 35 of the image sensor 11 and the metal wiring layers 32 can be fabricated with high accuracy.

Next, as illustrated in D of FIG. 3, the re-distribution layer 31 including the metal wiring layers 32 and the insulating layer 33, and the external terminals 34 are formed. For the metal wiring layers 32, for example, Al, Al—Cu, Al—Si, Al—Nd, Cu, Au, Ag, or the like, is used. For the insulating layer 33, for example, a polymer such as polyimide or epoxy, or an inorganic material such as $SiO_x$ or $SiN_x$ is used. It is preferable to form a laminated barrier such as Ni/Au or Ni/Pd/Au on a pad portion of each metal wiring layer 32 connected to the external terminal 34. The metal wiring layers 32 and the insulating layer 33 can be formed by, for example, a sputtering method, a CVD method, a vapor deposition method, a plating method, a printing method, or the like. The external terminals 34 each may be a metal bump formed by, for example, a printing method, a vapor deposition method, a plating method, or the like, but may have a structure in which the pad portion of each metal wiring layer 32 is exposed as it is.

Finally, as illustrated in E of FIG. 3, singulation is performed by dicing or the like utilizing a blade, laser, or the like, thereby completing the image sensor package 1 of the first embodiment illustrated in FIG. 1.

In the first manufacturing method, the image sensors 11 are aligned on the glass substrate 23, and then the re-distribution layer 31 and the external terminals 34 are formed. In general, the glass substrate has high dimensional stability against heat and moisture and is resistant to warping. Wiring technology on a glass substrate is also used in the field of thin film transistor (TFT) and the like. By performing wiring processing on the glass substrate 23 as in the first manufacturing method, it is possible to perform very fine wiring processing in which the line/space of 10/10μ or less is achieved for the re-distribution layer 31.

<1.3 First Variation of First Embodiment>

Figure 4:
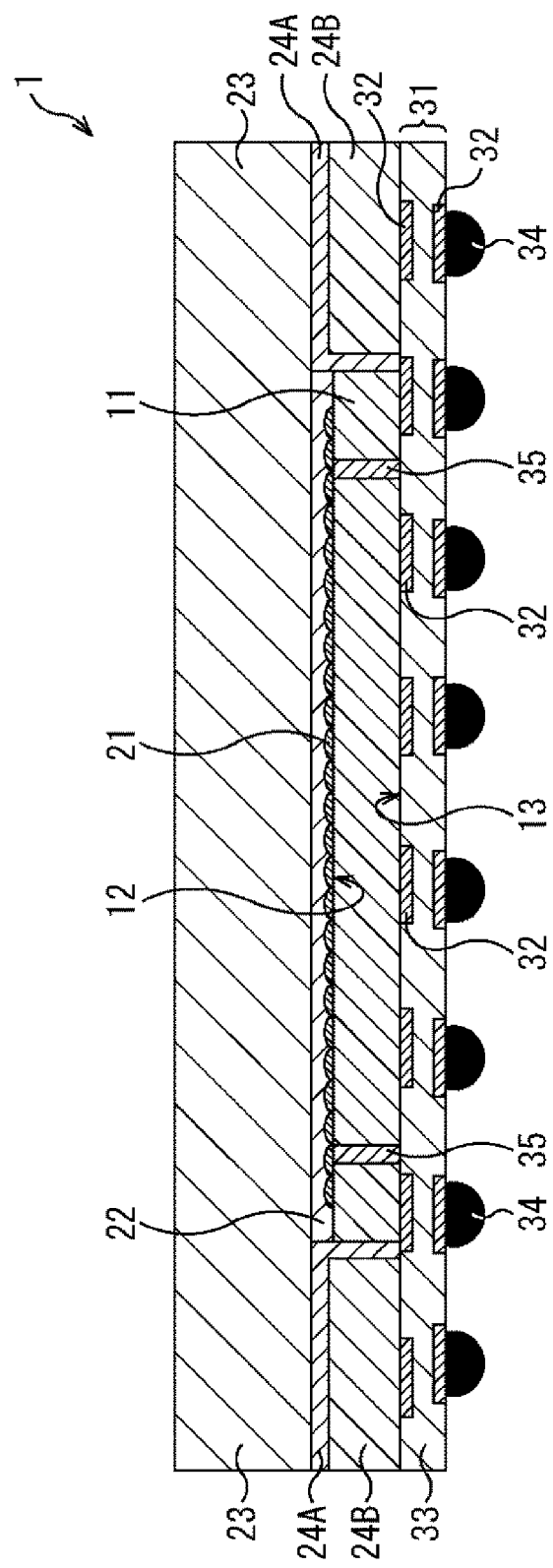
FIG. 4 is a cross-sectional view illustrating a first variation of the first embodiment.

FIG. 4 is a cross-sectional view of an image sensor package 1 illustrating a first variation of the first embodiment.

In the first variation of the first embodiment illustrated in FIG. 4, a difference from the first embodiment illustrated in FIG. 1 resides in that the covering portion 24 on the side surfaces of the image sensor 11 is replaced by two types of covering portions 24A and 24B.

Of the two types of covering portions 24A and 24B, the covering portion 24A in contact with the image sensor 11 includes a light-blocking material having a transmittance of light ranging from visible light to near infrared light of 10% or less. On the other hand, the covering portion 24B includes a heat-dissipating material having a thermal conductivity of 0.5 W/m·K or more.

These two types of covering portions 24A and 24B can be formed as follows. In the step of forming the covering portion 24 illustrated in B of FIG. 3, first, covering is performed with a light-blocking material serving as the covering portion 24A by a printing method, a coating method, a vapor deposition method, a lamination method, a molding method, or the like, and then covering is performed with a heat-dissipating material serving as the covering portion 24B by a similar method.

In this way, by using the light-blocking material as the covering portion 24A in contact with the image sensor 11, it is possible to absorb stray light entering from the side surfaces of the image sensor 11 and a lower surface of the glass substrate 23 and to prevent unintended light from entering the light-receiving unit of the image sensor 11.

In addition, it is possible to form a heat dissipation path for dissipating heat generated from the image sensor 11 by using the heat-dissipating material as the covering portion 24B located outside the covering portion 24A.

Note that the covering portion 24 may be constituted by three types of covering materials, and it is sufficient for the covering portion 24 to be a structure where covering is performed with one or more types of covering materials.

<1.4 Second Variation of First Embodiment>

Figure 5:
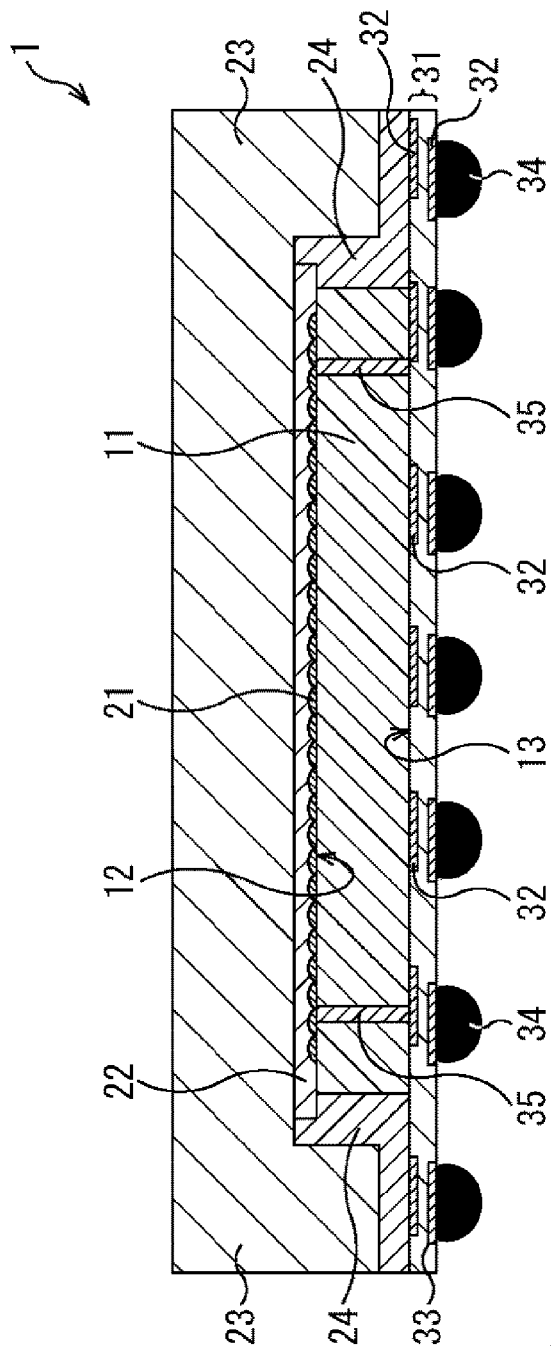
FIG. 5 is a cross-sectional view illustrating a second variation of the first embodiment.

FIG. 5 is a cross-sectional view of an image sensor package 1 illustrating a second variation of the first embodiment.

In the second variation of the first embodiment illustrated in FIG. 5, a difference from the first embodiment of FIG. 1 resides in that the glass substrate 23 is formed to be thicker in the outer peripheral portion outside the image sensor 11 than in a portion above the image sensor 11. On the other hand, the covering portion 24 is formed to be thinner in a portion where the glass substrate 23 is thick than in the other portion.

The height of the lens structure 173 (FIG. 29), which is arranged above the image sensor package 1 and is constituted by a plurality of lenses for concentrating incident light on the light-receiving unit of the image sensor 11, is determined depending on optical path length. In a case where there is a member having a refractive index larger than air on an optical axis, the optical path length increases accordingly, and the height of the lens structure 173 also increases accordingly. The refractive index of the glass substrate 23 is 1.5. Thus, the optical path length increases in excess by about ⅓ of the thickness of the glass substrate 23 on the optical axis, and the height of the camera module 151 increases. Therefore, the thinner the glass substrate 23 on the optical axis is, the better. However, there may be a case where thinning of the glass substrate 23 results in a decrease in rigidity, which causes deflection of the image sensor 11.

Therefore, as in the second variation, the glass substrate 23 is adopted which is formed to be thicker in the outer peripheral portion outside the image sensor 11 than in the portion above the image sensor 11, and thereby the rigidity of the glass substrate 23 and the image sensor 11 can be maintained by the thick glass portion (stiffener structure) of the outer peripheral portion and the covering portion 24 while thinning the thickness of the glass substrate 23 on the optical axis. Thus, it is possible to suppress the warping and deflection of the image sensor 11 while shortening the optical path length of the optical path length.

2. Second Embodiment

<2.1 Structural View of Second Embodiment>

Figure 6:
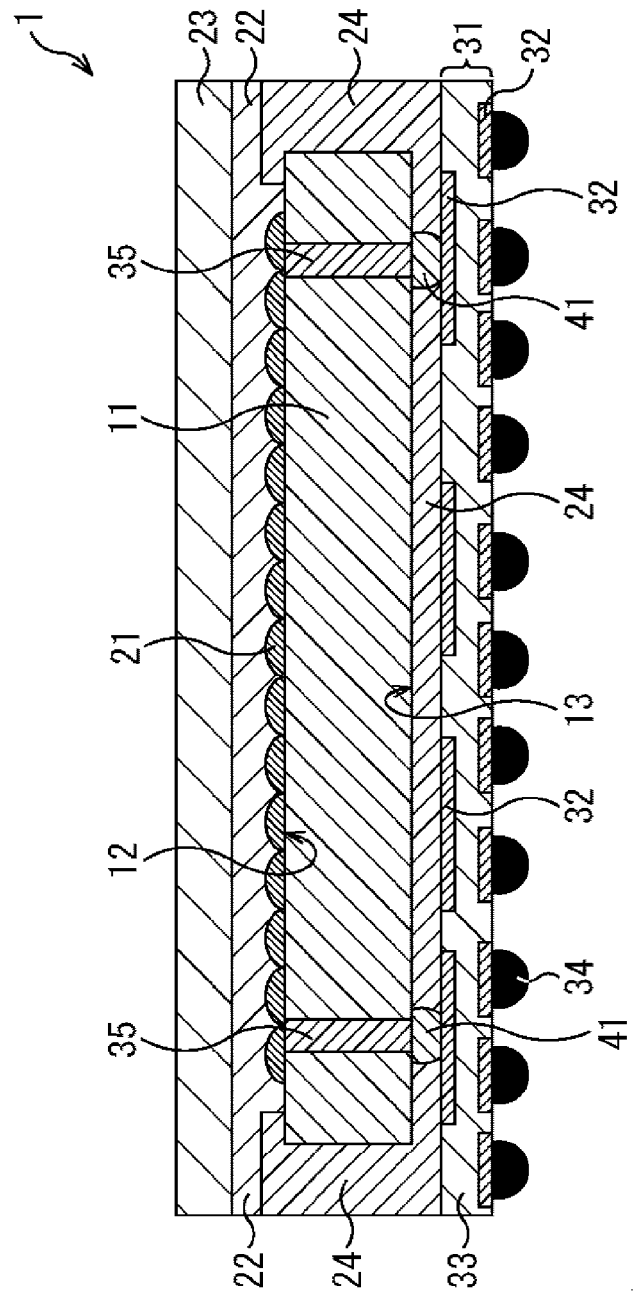
FIG. 6 is a cross-sectional view of an image sensor package as a second embodiment of a semiconductor device to which the present technology is applied.

FIG. 6 illustrates a cross-sectional view of an image sensor package as a second embodiment of a semiconductor device to which the present technology is applied.

Note that in FIG. 6, portions corresponding to those in the first embodiment are denoted by the same reference signs, and descriptions will be given only for portions different from those in the first embodiment. This applies to other embodiments described later, similarly.

In the image sensor package 1 of the second embodiment illustrated in FIG. 6, a difference from the first embodiment resides in that a covering portion 24 is formed between a second main surface 13, which is a surface of an image sensor 11 on a side of external terminals 34, and a re-distribution layer 31.

In addition, metal bumps 41 are each provided on a part of the covering portion 24 between the second main surface 13 and the re-distribution layer 31, and TSVs 35 of the image sensor 11 are connected to metal wiring layers 32 of the re-distribution layer 31 via the metal bumps 41. The metal bumps 41 are each constituted by, for example, an Sn—Ag bump, an Sn—Ag—Cu bump, an Au stud bump, or the like, and the periphery thereof is covered with the covering portion 24.

Furthermore, although the light transmissive member 22 is formed only on the image sensor 11 in the first embodiment, in the second embodiment, a light transmissive member 22 is formed also on the covering portion 24 located outside the image sensor 11, and is in contact with the entire region of a lower surface of a glass substrate 23.

Although the illustration of a plan view of the image sensor package 1 in the second embodiment as viewed from the side of the external terminals 34 is omitted, similarly to FIG. 2, the metal wiring layers 32 are formed as fan-out wiring extending to an outer peripheral portion, and are connected to the external terminals 34.

Therefore, also in the second embodiment, it is possible to cope with an increase in the number of I/Os of the image sensor 11, i.e. to provide more external terminals 34, by forming the metal wiring layers 32 as fan-out wiring extending to the outer peripheral portion, similarly to the first embodiment.

In addition, since side surfaces and a rear surface of the image sensor 11 are covered with the covering portion 24, it is possible to simultaneously protect the side surfaces and the rear surface of the image sensor 11.

In the example of FIG. 6, the covering portion 24 includes one type of resin material. However, similarly to the first variation of the first embodiment, the covering portion 24 may be formed by lamination of two or more types of resin materials.

<2.2 Manufacturing Method of Second Embodiment>

Next, a manufacturing method (second manufacturing method) of the image sensor package 1 of the second embodiment will be described with reference to FIG. 7.

First, the image sensors 11 which have been singulated are prepared. As illustrated in A of FIG. 7, the prepared image sensors 11 are each an image sensor in which on-chip lenses 21 formed on a side of a first main surface 12 are protected by a removable protective film 42 and the metal bumps 41 are formed on a side of the second main surface 13.

Figure 7:
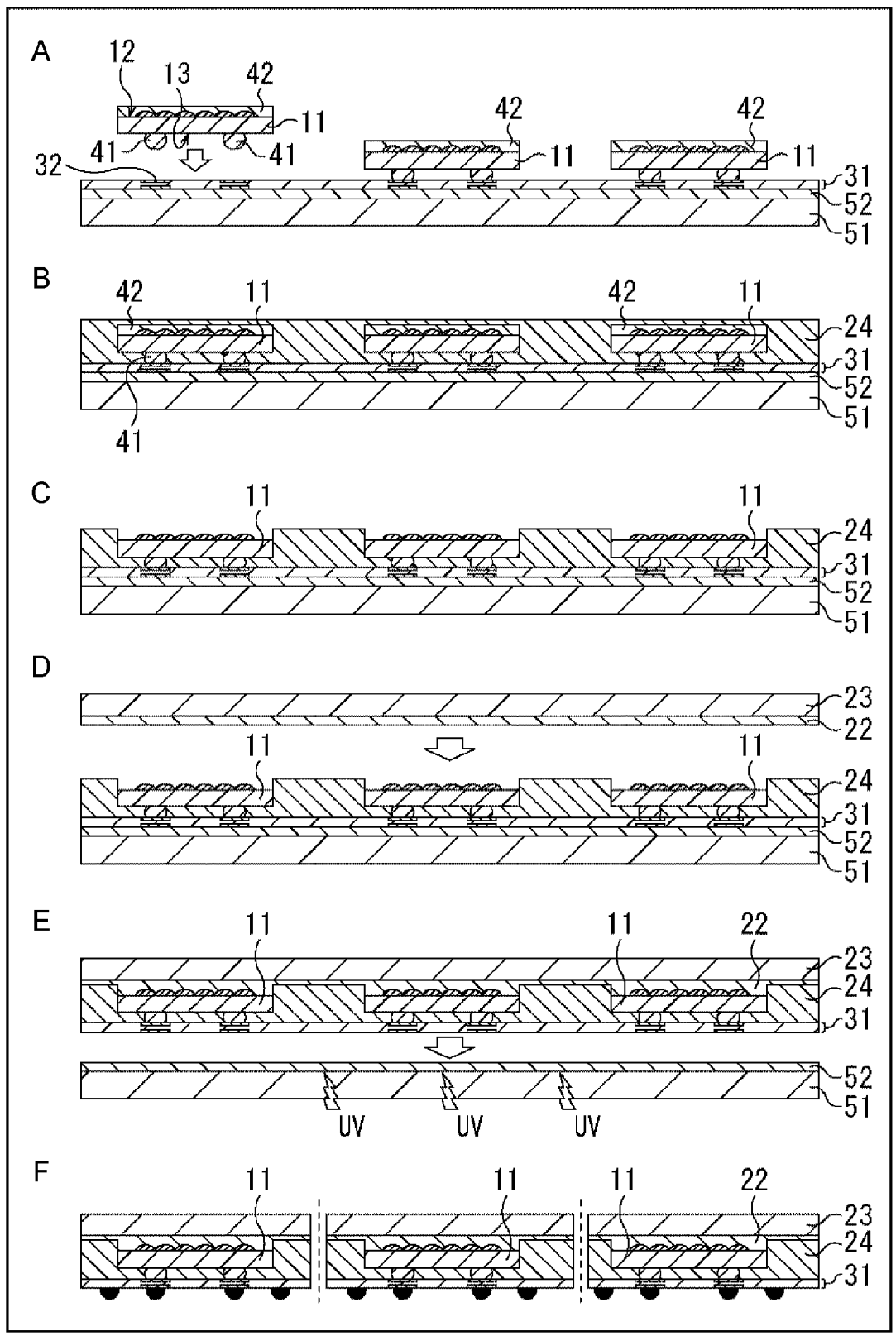
FIG. 7 is a set of views explaining a method for manufacturing the image sensor package of the second embodiment.

Then, as illustrated in A of FIG. 7, the prepared image sensors 11 are flip-chip mounted on a carrier substrate 51 on which the re-distribution layer 31 has been formed via an adhesive 52 which can be released by ultraviolet rays (UV). More specifically, the metal bumps 41 of the image sensors 11 and the metal wiring layers 32 are subjected to flip chip bonding such that the metal bumps 41 are arranged on the metal wiring layers 32 on the outermost surface of the re-distribution layer 31. Similarly to the glass substrate 23, the carrier substrate 51 is constituted by, for example, quartz glass or the like in a form of a wafer or a panel.

As is apparent from comparison between A of FIG. 3 and A of FIG. 7, the image sensors 11 are adhered so that the light-receiving surfaces thereof face the glass substrate 23 in the first manufacturing method illustrated in FIG. 3, whereas the image sensors 11 are flip-chip mounted on the carrier substrate 51 so that the light receiving surfaces thereof face upward in the second manufacturing method.

Next, as illustrated in B of FIG. 7, the surface of the carrier substrate 51 on which the image sensors 11 are mounted is covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Next, as illustrated in C of FIG. 7, after the covering portion 24 is polished to be flat by mechanical grinding or chemical mechanical polishing until the protective film 42 formed on each image sensor 11 is exposed, the protective film 42 is removed. In the grinding of the covering portion 24, it suffices to perform grinding to the extent that the protective film 42 is exposed, and therefore grinding precision does not need to be very high.

Next, as illustrated in D of FIG. 7, the glass substrate 23 and the carrier substrate 51 on which the image sensors 11 are mounted are subjected to wafer-to-wafer bonding using the light transmissive member 22 as an adhesive.

Subsequently, as illustrated in E of FIG. 7, the carrier substrate 51 is released by irradiation with ultraviolet rays (UV) from a back surface side of the carrier substrate 51. When the carrier substrate 51 is released, a substrate structure is completed in which the image sensors 11 are aligned so that the light-receiving surfaces thereof face the glass substrate 23. The side surfaces of the image sensors 11 are covered with the covering portion 24, and the re-distribution layer 31 is formed on the side of the second main surface 13 of each image sensor 11.

Finally, as illustrated in F of FIG. 7, singulation is performed by dicing or the like utilizing a blade, laser, or the like, thereby completing the image sensor package 1 of the second embodiment illustrated in FIG. 6.

3. Third Embodiment

<3.1 Structural View of Third Embodiment>

Figure 8:
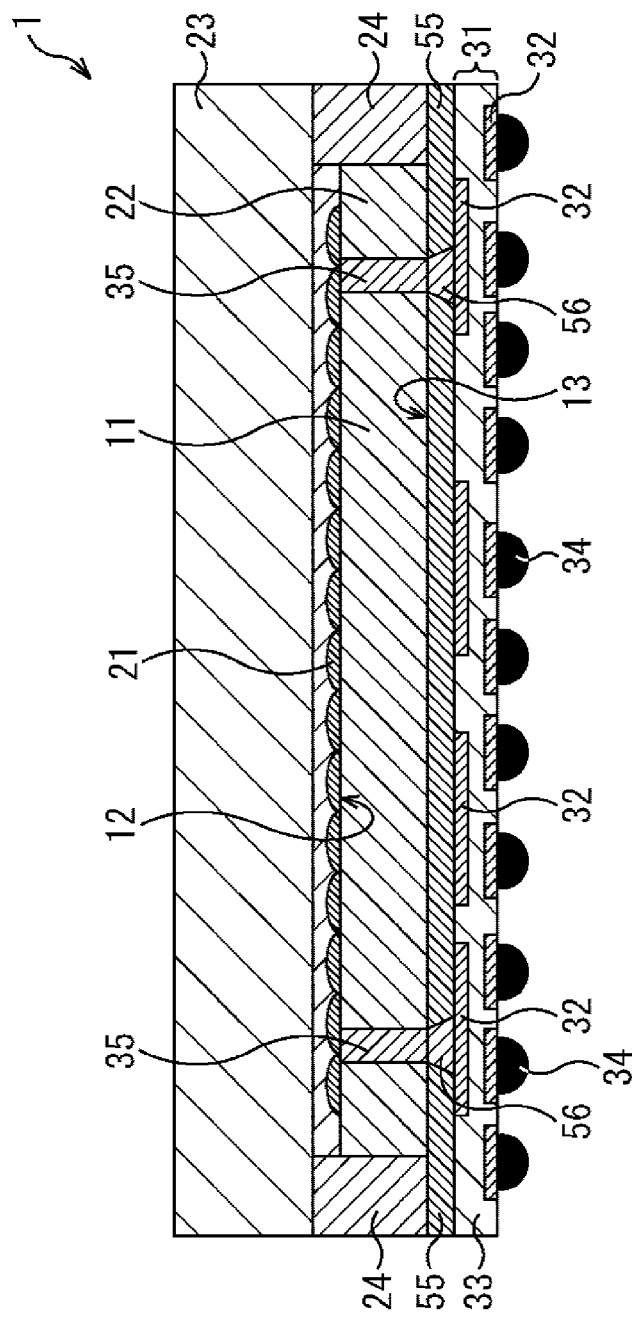
FIG. 8 is a cross-sectional view of an image sensor package as a third embodiment of a semiconductor device to which the present technology is applied.

FIG. 8 illustrates a cross-sectional view of an image sensor package as a third embodiment of a semiconductor device to which the present technology is applied.

In the image sensor package 1 of the third embodiment illustrated in FIG. 8, a difference from the first embodiment resides in that a covering portion 55 is newly formed between a second main surface 13, which is a surface of an image sensor 11 on a side of external terminals 34, and a re-distribution layer 31. As will be described later with reference to FIG. 9, the covering portion 55 is formed in a separate step from a covering portion 24 formed on side surfaces of the image sensors 11, but the materials of the covering portion 55 and the covering portion 24 may be the same. Alternatively, materials having different characteristics may be used for the covering portion 55 and the covering portion 24. For example, as in the first variation of the first embodiment illustrated in FIG. 4, a light-blocking material may be used for one of the covering portion 24 and the covering portion 55, and a heat-dissipating material may be used for the other thereof.

TSVs 35 of the image sensor 11 are each connected to a metal wiring layer 32 of the re-distribution layer 31 via a via 56 provided in the same layer as the covering portion 55. The periphery of the via 56 is covered with the covering portion 55.

Although the illustration of a plan view of the image sensor package 1 in the third embodiment as viewed from the side of the external terminals 34 is omitted, similarly to FIG. 2, the metal wiring layers 32 are formed as fan-out wiring extending to an outer peripheral portion, and are connected to the external terminals 34.

Therefore, also in the third embodiment, it is possible to cope with an increase in the number of I/Os of the image sensor 11, i.e. to provide more external terminals 34, by forming the metal wiring layers 32 as fan-out wiring extending to the outer peripheral portion, similarly to the first embodiment.

In addition, since the side surfaces and a rear surface of the image sensor 11 are covered with the covering portion 24 or 55, it is possible to simultaneously protect the side surfaces and the rear surface of the image sensor 11.

<3.2 Manufacturing Method of Third Embodiment>

Next, a manufacturing method (third manufacturing method) of the image sensor package 1 of the third embodiment will be described with reference to FIG. 9.

Figure 9:
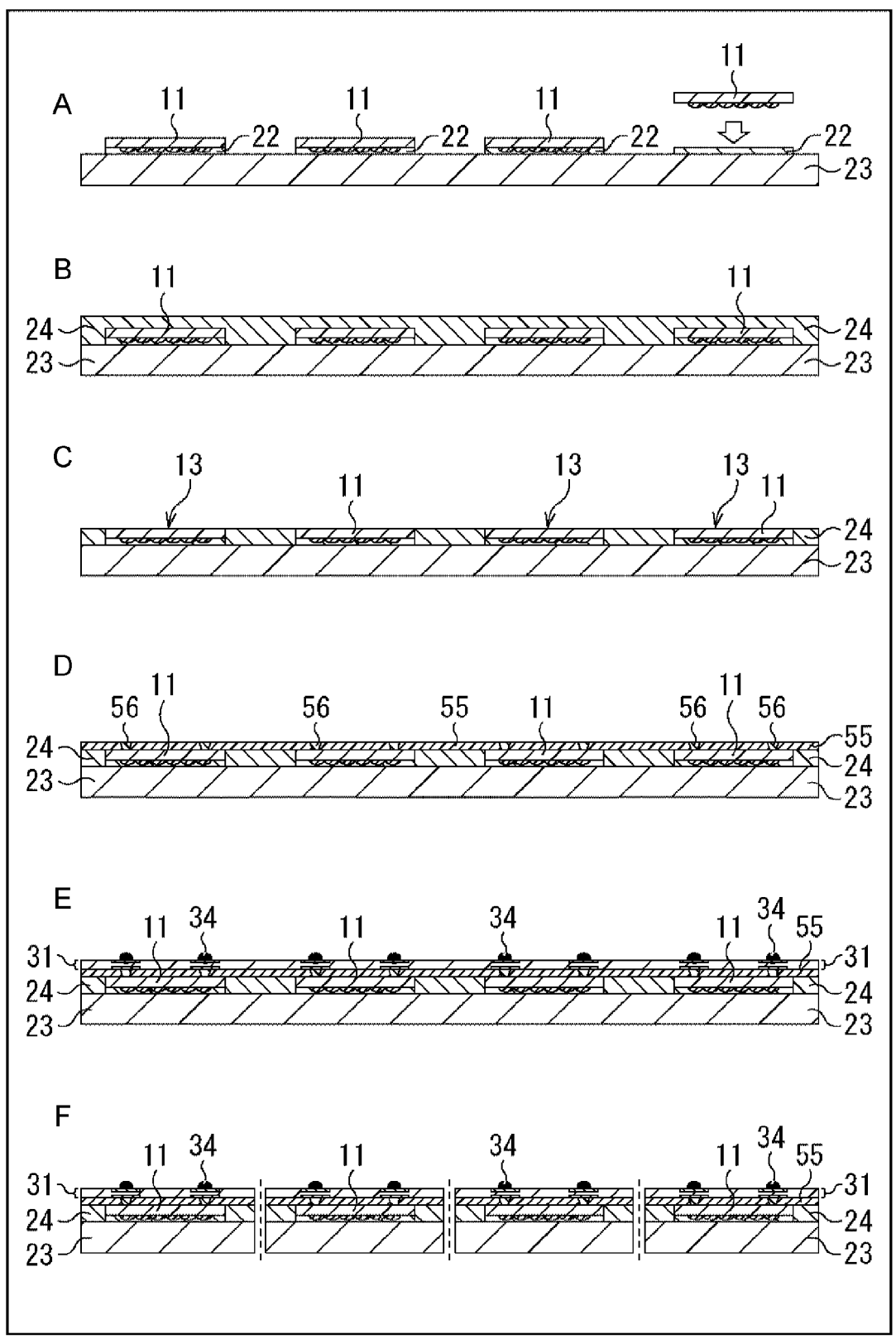
FIG. 9 is a set of views explaining a method for manufacturing the image sensor package of the third embodiment.

The steps in A to C of FIG. 9 are similar to the steps in A to C of FIG. 3.

That is, first, as illustrated in A of FIG. 9, the singulated image sensors 11 are mounted on a glass substrate 23.

Next, as illustrated in B of FIG. 9, a surface of the glass substrate 23 on which the image sensors 11 are mounted is covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in C of FIG. 9, the second main surface 13 of each image sensor 11 is exposed by grinding the surface of the covering portion 24 thus formed by mechanical grinding, chemical mechanical polishing, or the like.

Next, as illustrated in D of FIG. 9, the entire surface including the exposed second main surface 13 of each image sensor 11 is covered with a predetermined covering material by a printing method, a coating method, a vapor deposition method, a lamination method, or the like, and thereby the covering portion 55 is formed. Since the surface to be re-covered is flat, a surface obtained after the re-covering can maintain flatness, as well.

Next, as illustrated in D of FIG. 9, the vias 56 are formed by forming openings in the surface covered with the covering portion 55, at positions where the TSVs 35 of the image sensors 11 are arranged, and then burying a metal material in each opening, forming a metal material conformal to each opening, or the like. The openings can be formed by, for example, wet etching, dry etching, mechanical drilling, laser drilling, or the like.

The steps in E and F of FIG. 9 are similar to the steps described with reference to D and E of FIG. 3.

That is, as illustrated in E of FIG. 9, the re-distribution layer 31 including the metal wiring layers 32 and the insulating layer 33, and the external terminals 34 are formed on a flat surface where the covering portion 55 and the vias 56 are formed. Then, as illustrated in F of FIG. 9, singulation is performed by dicing or the like utilizing a blade, laser, or the like, thereby completing the image sensor package 1 of the third embodiment illustrated in FIG. 8.

Also in the third manufacturing method, since the re-distribution layer 31 is formed on the glass substrate 23, extremely fine wiring processing can be achieved similarly to the first manufacturing method.

4. Fourth Embodiment

<4.1 Structural Views of Fourth Embodiment>

Figure 10:
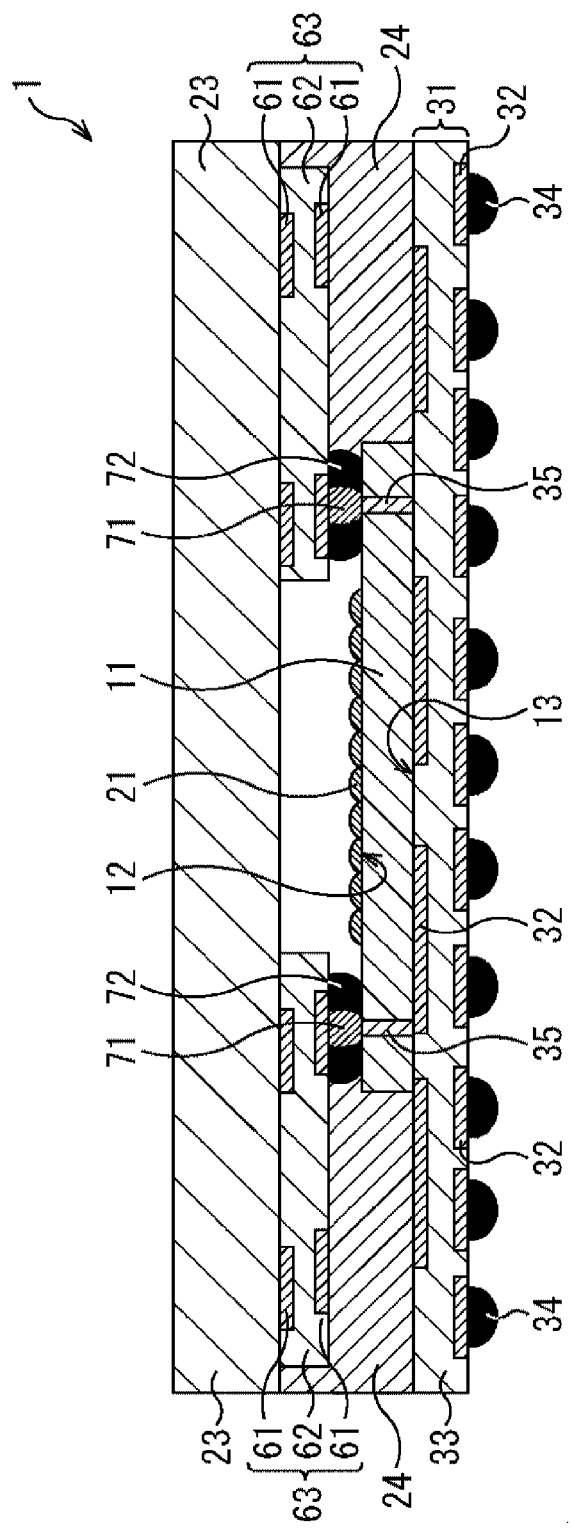
FIG. 10 is a cross-sectional view of an image sensor package as a fourth embodiment of a semiconductor device to which the present technology is applied.

FIG. 10 illustrates a cross-sectional view of an image sensor package as a fourth embodiment of a semiconductor device to which the present technology is applied.

In the image sensor package 1 of the fourth embodiment illustrated in FIG. 10, a wiring layer 63 is arranged between a glass substrate 23 and an image sensor 11. The wiring layer 63 includes a plurality of metal wiring layers 61 and an insulating layer 62 formed between the metal wiring layers 61. The wiring layer 63 is bonded to metal bumps 71 formed on a first main surface 12 of the image sensor 11. An underfill 72 is formed around the metal bumps 71. The wiring layer 63 plays a role of connecting both of the glass substrate 23 and the metal bumps 71 of the image sensor 11, and there is no particular need to form a circuit for performing signal processing.

Figure 11:
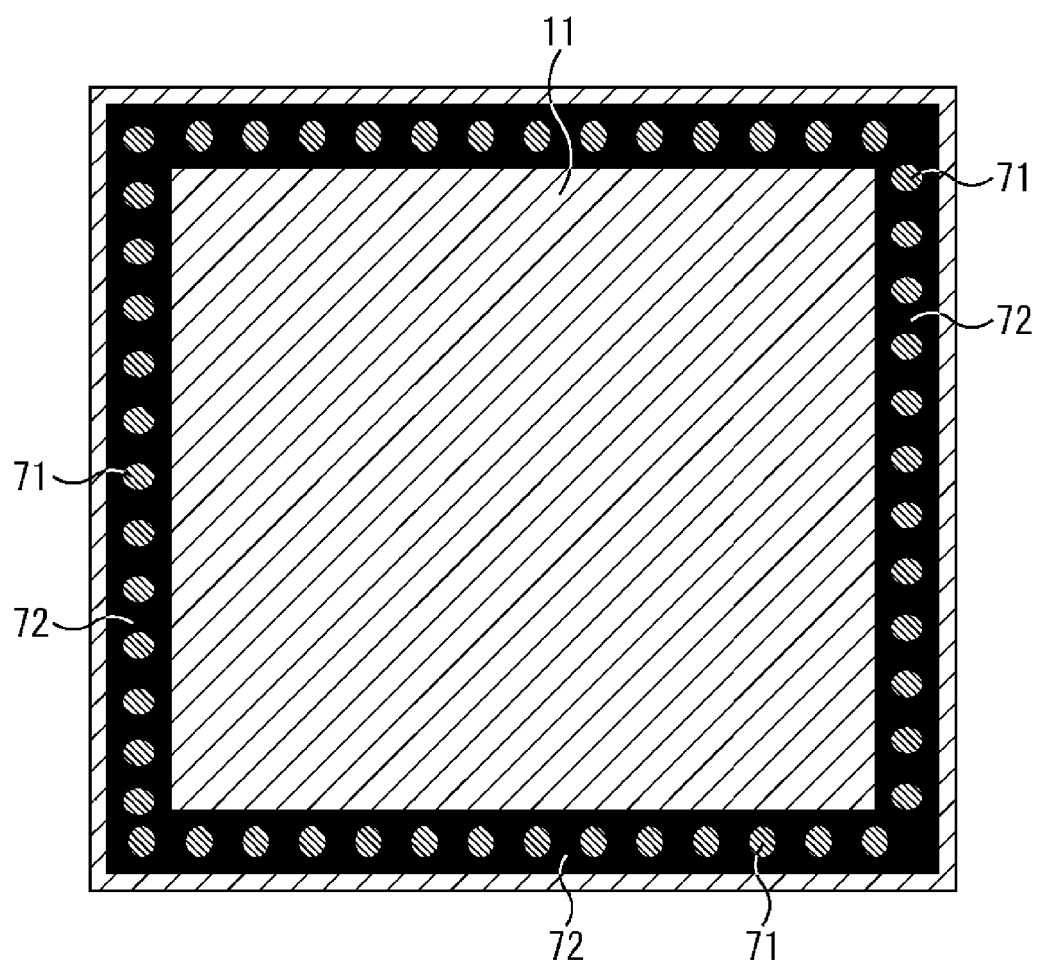
FIG. 11 is a plan view of an image sensor of the fourth embodiment.

As illustrated in FIG. 11, the metal bumps 71 and the underfill 72 are arranged on a peripheral portion on the first main surface 12 of the image sensor 11 so as to surround the outer periphery. In FIG. 10, a space, which is surrounded by the image sensor 11, and the wiring layer 63 and the glass substrate 23 above the image sensor 11, is sealed by the underfill 72. Thus, it is possible to protect a light-receiving unit of the image sensor 11 from grit, dust, and the like.

The metal wiring layers 61 and the insulating layer 62 constituting the wiring layer 63 are formed using materials similar to those of the metal wiring layers 32 and the insulating layer 33 of the re-distribution layer 31 described above. In addition, the metal wiring layers 61 are connected to each other by a through hole (not illustrated) formed in the insulating layer 62.

Side surfaces of the image sensor 11 are covered with a covering portion 24.

Although the illustration of a plan view of the image sensor package 1 in the fourth embodiment as viewed from a side of external terminals 34 is omitted, similarly to FIG. 2, metal wiring layers 32 are formed as fan-out wiring extending to an outer peripheral portion, and are connected to the external terminals 34.

Therefore, also in the fourth embodiment, it is possible to cope with an increase in the number of I/Os of the image sensor 11, i.e. to provide more external terminals 34, by forming the metal wiring layers 32 as fan-out wiring extending to the outer peripheral portion, similarly to the first embodiment.

In addition, since the side surfaces of the image sensor 11 are covered with the covering portion 24, the side surfaces of the image sensor 11 can be protected.

<4.2 Manufacturing Method of Fourth Embodiment>

Next, a manufacturing method (fourth manufacturing method) of the image sensor package 1 of the fourth embodiment will be described with reference to FIG. 12.

First, the image sensors 11 which have been singulated are prepared. As illustrated in A of FIG. 12, the image sensors 11 prepared in the fourth manufacturing method are each an image sensor 11 in which the metal bumps 71 are formed on a side of the first main surface 12 where on-chip lenses 21 are formed. Similarly to the second embodiment, the metal bumps 71 are each constituted by, for example, an Sn—Ag bump, an Sn—Ag—Cu bump, an Au stud bump, or the like.

In addition, in the fourth manufacturing method, besides the image sensors 11 having the metal bumps 71 formed thereon, the glass substrate 23 having the wiring layers 63 formed on the substrate is prepared.

Figure 12:
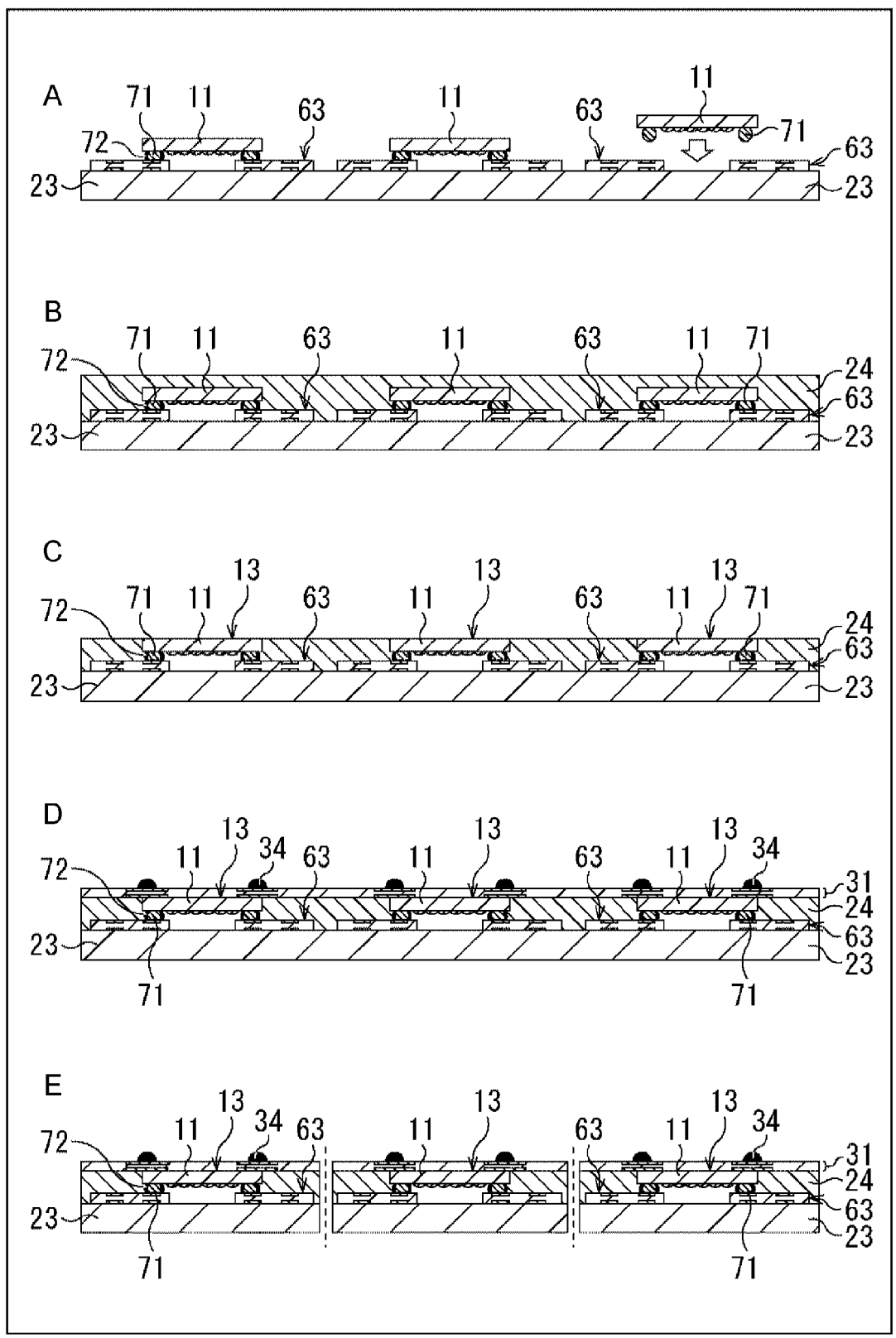
FIG. 12 is a set of views explaining a method for manufacturing the image sensor package of the fourth embodiment.

Then, the prepared image sensors 11 are each flip-chip mounted on the metal wiring layer 61 of the wiring layer 63 formed on the glass substrate 23 as illustrated in A of FIG. 12. That is, the metal bumps 71 of the image sensors 11 and the metal wiring layers 61 are subjected to flip chip bonding such that the metal bumps 71 are arranged on the metal wiring layers 61 on the outermost surface of the wiring layer 63.

In addition, as illustrated in FIG. 11, the underfill 72 is formed around the flip-chip bonded metal bumps 71 so as to surround the outer periphery of the image sensor 11.

High resistance metal (Ti, TiN, Mo, Mo—Nb, or the like) may be formed as a barrier layer only on a bottom surface or on both the bottom surface and an upper surface of each metal wiring layer 61.

The respective steps illustrated in B to E of FIG. 12 are similar to the respective steps illustrated in B to E of FIG. 3.

That is, as illustrated in B of FIG. 12, a surface of the glass substrate 23 on which the image sensors 11 are mounted is covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in C of FIG. 12, the second main surface 13 of each image sensor 11 is exposed by grinding the surface of the covering portion 24 thus formed by mechanical grinding, chemical mechanical polishing, or the like.

Next, as illustrated in D of FIG. 12, a re-distribution layer 31 including the metal wiring layers 32 and the insulating layer 33, and the external terminals 34 are formed.

Finally, as illustrated in E of FIG. 12, singulation is performed by dicing or the like utilizing a blade, laser, or the like, thereby completing the image sensor package 1 of the fourth embodiment illustrated in FIG. 10.

Also in the fourth manufacturing method, since the wiring layer 63 and the re-distribution layer 31 are formed on the glass substrate 23, extremely fine wiring processing can be achieved similarly to the first manufacturing method.

<4.3 First Variation of Fourth Embodiment>

Figure 13:
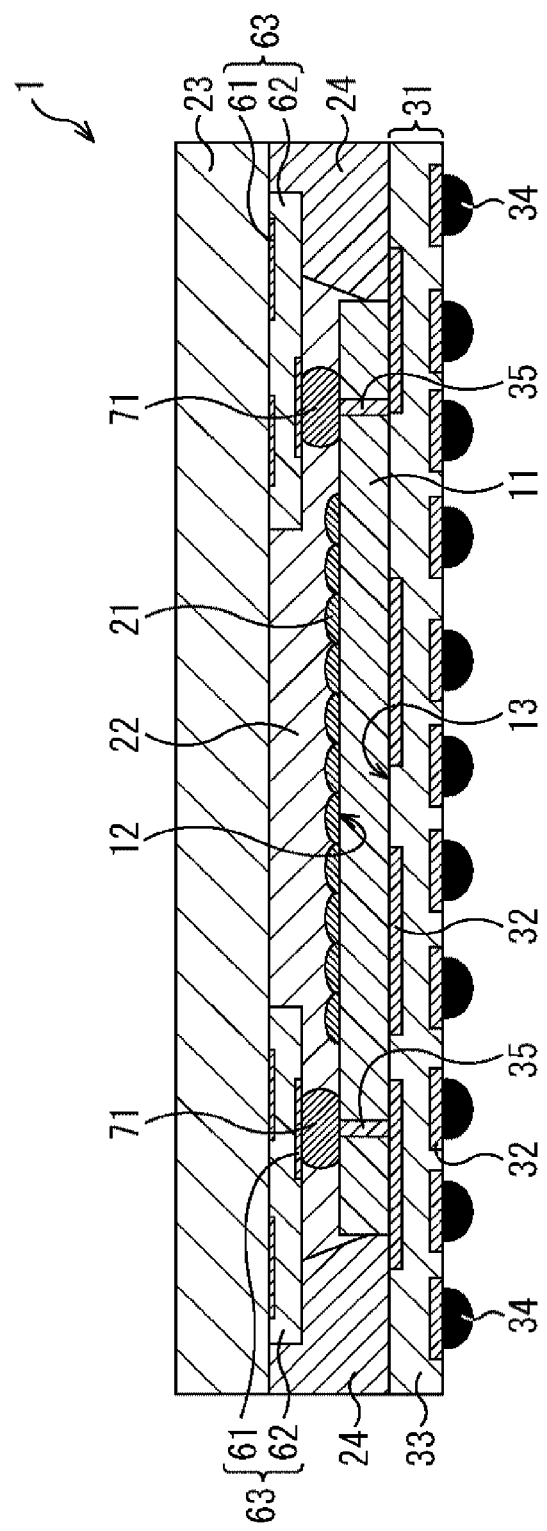
FIG. 13 is a cross-sectional view illustrating a first variation of the fourth embodiment.

FIG. 13 is a cross-sectional view of an image sensor package 1 illustrating a first variation of the fourth embodiment.

In the fourth embodiment illustrated in FIG. 13, air is enclosed in the space surrounded by the image sensor 11, and the wiring layer 63 and the glass substrate 23 above the image sensor 11, whereas in the first variation of the fourth embodiment illustrated in FIG. 13, a light transmissive member 22 is enclosed therein. Since the light transmissive member 22 is enclosed, the underfill 72 of the fourth embodiment is omitted.

For the light transmissive member 22, a material whose refractive index is, for example, about 0.5 to 3.0 can be used, but the refractive index is more preferably close to the refractive index of the glass substrate 23.

The light transmissive member 22 and the glass substrate 23 can protect the light-receiving unit of the image sensor 11 from grit, dust, and the like.

<4.4 Second Variation of Fourth Embodiment>

Figure 14:
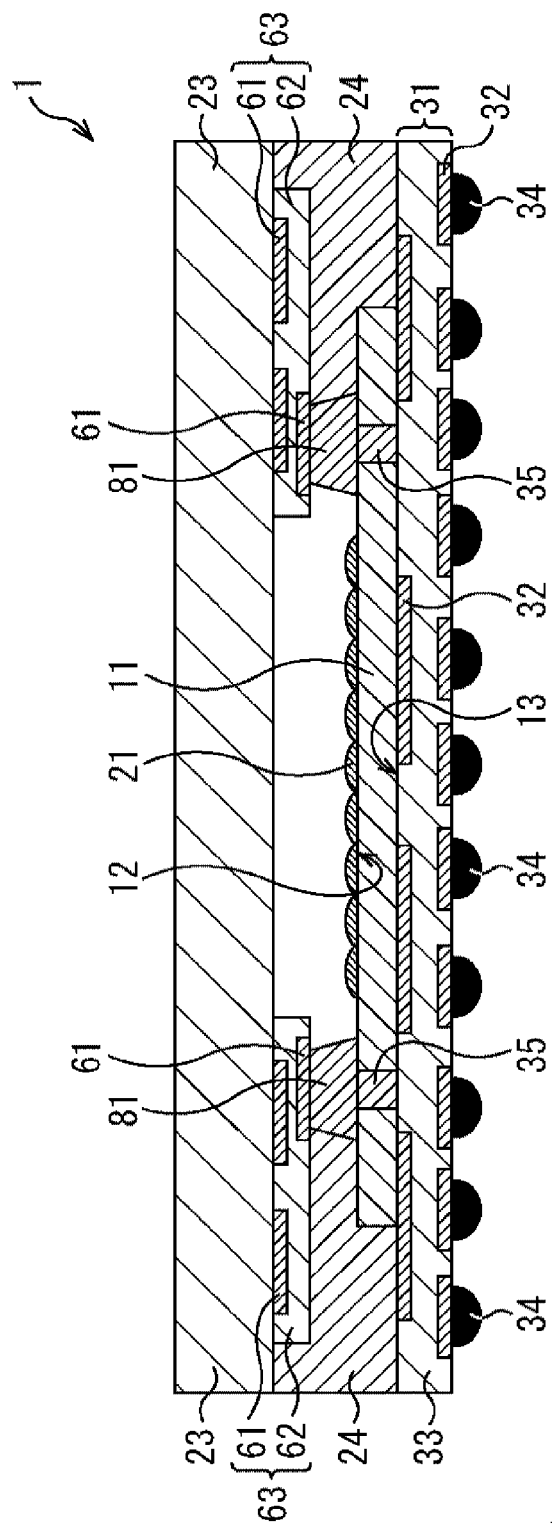
FIG. 14 is a cross-sectional view illustrating a second variation of the fourth embodiment.

FIG. 14 is a cross-sectional view of an image sensor package 1 illustrating a second variation of the fourth embodiment.

Figure 15:
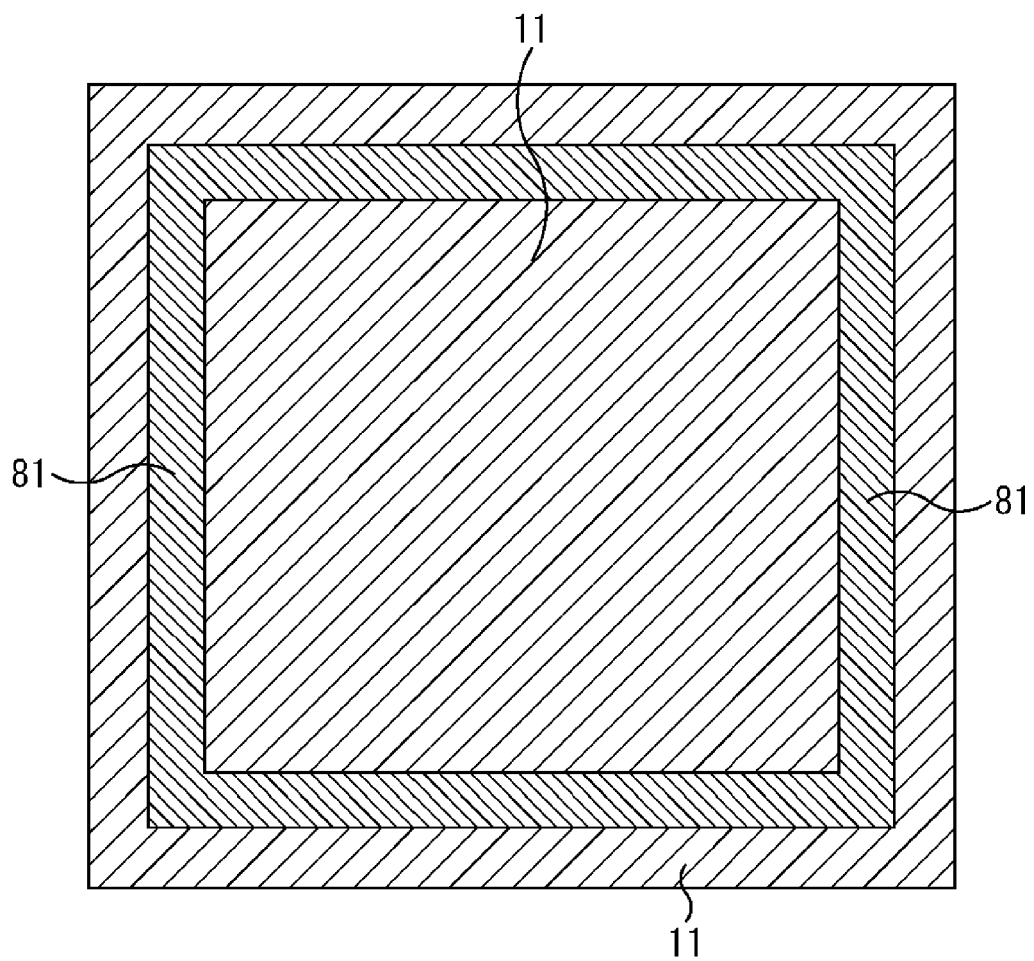
FIG. 15 is a plan view of an image sensor of the second variation of the fourth embodiment.

In the second variation of the fourth embodiment illustrated in FIG. 14, the metal bumps 71 and the underfill 72 of the fourth embodiment illustrated in FIG. 10 are replaced by a metal member 81. As illustrated in FIG. 15, the metal member 81 is arranged so as to surround the outer periphery of the image sensor 11. FIG. 15 is a plan view in which the metal member 81 is viewed from the side of the first main surface 12 of the image sensor 11.

In this way, it is possible to protect the light-receiving unit of the image sensor 11 from grit, dust, and the like also by surrounding the light-receiving unit of the image sensor 11 with the metal member 81.

<4.5 Third Variation of Fourth Embodiment>

Figure 16:
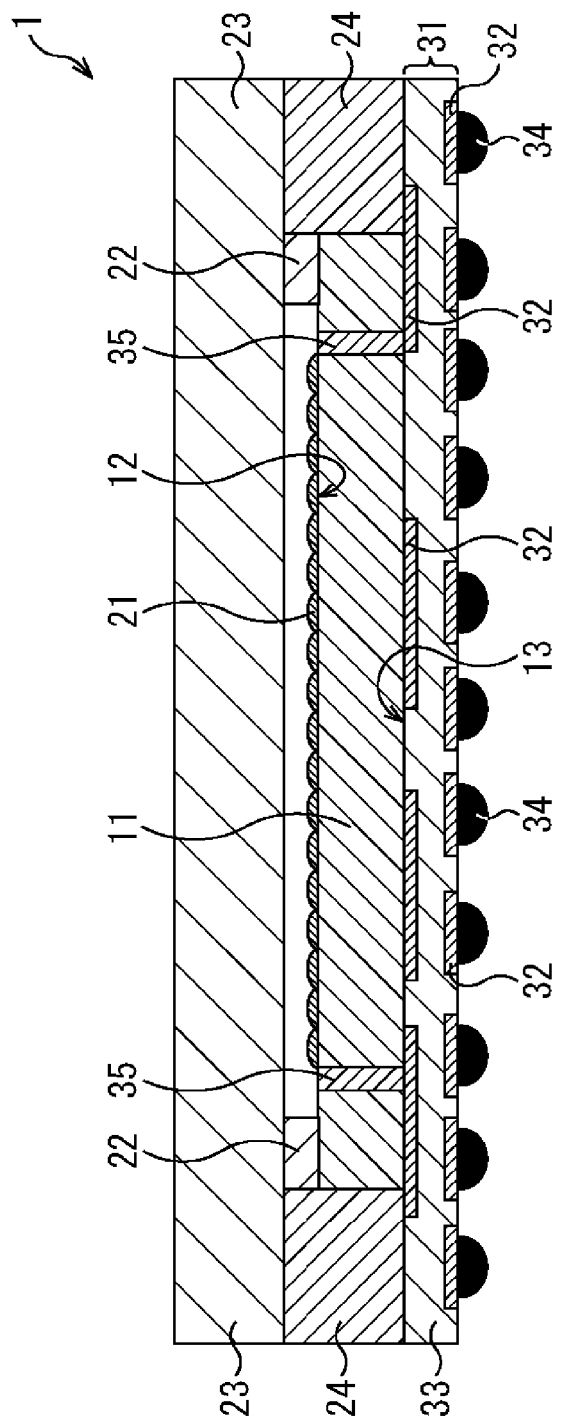
FIG. 16 is a cross-sectional view illustrating a third variation of the fourth embodiment.

FIG. 16 is a cross-sectional view of an image sensor package 1 illustrating a third variation of the fourth embodiment.

In the third variation of the fourth embodiment illustrated in FIG. 16, the metal bumps 71 and the underfill 72 of the fourth embodiment illustrated in FIG. 10 are replaced by the light transmissive member 22. The light transmissive member 22 is arranged so as to surround the outer periphery of the image sensor 11, similarly to the arrangement of the metal member 81 illustrated in FIG. 15.

Since the light transmissive member 22 plays a role of an adhesive for adhering the image sensor 11 and the glass substrate 23, the wiring layer 63 is omitted in the third variation of FIG. 16.

In this way, it is possible to protect the light-receiving unit of the image sensor 11 from grit, dust, and the like also by surrounding the light-receiving unit of the image sensor 11 with the light transmissive member 22.

5. Fifth Embodiment

<5.1 Structural View of Fifth Embodiment>

Figure 17:
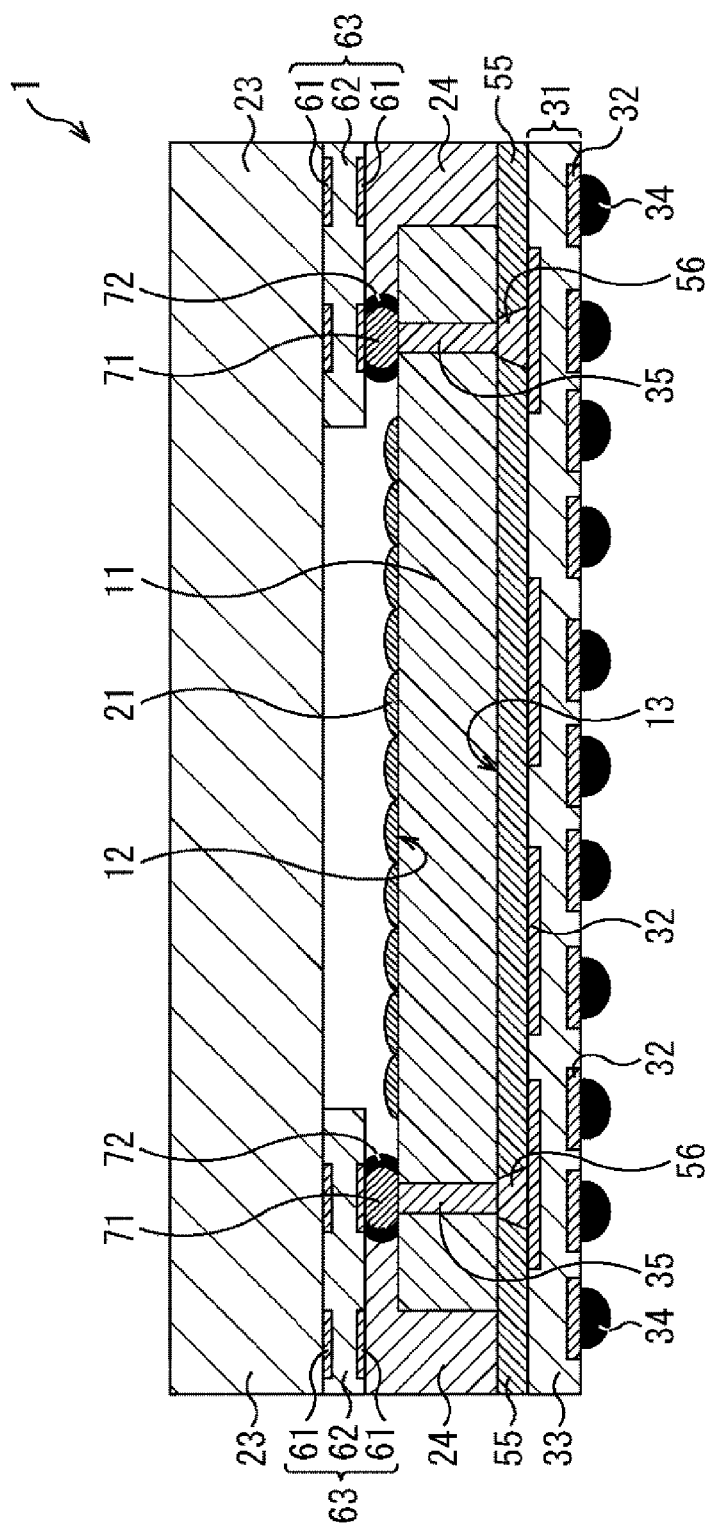
FIG. 17 is a cross-sectional view of an image sensor package as a fifth embodiment of a semiconductor device to which the present technology is applied.

FIG. 17 illustrates a cross-sectional view of an image sensor package as a fifth embodiment of a semiconductor device to which the present technology is applied.

In the image sensor package 1 of the fifth embodiment illustrated in FIG. 17, a difference from the fourth embodiment illustrated in FIG. 10 resides in that a covering portion 55 and vias 56 are formed between a second main surface 13, which is a surface of an image sensor 11 on a side of external terminals 34, and a re-distribution layer 31.

The covering portion 55 is formed in a separate step from a covering portion 24 formed on side surfaces of the image sensor 11 similarly to the third embodiment described above, but the materials of the covering portion 55 and the covering portion 24 may be the same as or different from each other.

TSVs 35 of the image sensor 11 are each connected to a metal wiring layer 32 of the re-distribution layer 31 via the via 56 provided in the same layer as the covering portion 55. The periphery of the via 56 is covered with the covering portion 55.

Note that in the fifth embodiment illustrated in FIG. 17, an upper surface of the covering portion 24 formed on the side surfaces of the image sensor 11 is in contact only with the wiring layer 63, whereas in the fourth embodiment of FIG. 10, a part of the upper surface of the covering portion 24 is in contact with the glass substrate 23, and either of the modes of the covering portion 24 may be adopted. Conversely, in the fourth embodiment of FIG. 10, the upper surface of the covering portion 24 may be configured so as to contact the wiring layer 63 only, or in the fifth embodiment of FIG. 17, the upper surface of the covering portion 24 may be configured so as to contact both a glass substrate 23 and the wiring layer 63.

Also in the fifth embodiment, the metal wiring layers 32 of the re-distribution layer 31 are formed as fan-out wiring extending to an outer peripheral portion, and are connected to the external terminals 34.

Therefore, also in the fifth embodiment, it is possible to cope with an increase in the number of I/Os of the image sensor 11, i.e. to provide more external terminals 34, similarly to the other embodiments described above. In addition, since the side surfaces of the image sensor 11 are covered with the covering portion 24, the side surfaces of the image sensor 11 can be protected.

<5.2 Manufacturing Method of Fifth Embodiment>

Next, a manufacturing method (fifth manufacturing method) of the image sensor package 1 of the fifth embodiment will be described with reference to FIG. 18.

Figure 18:
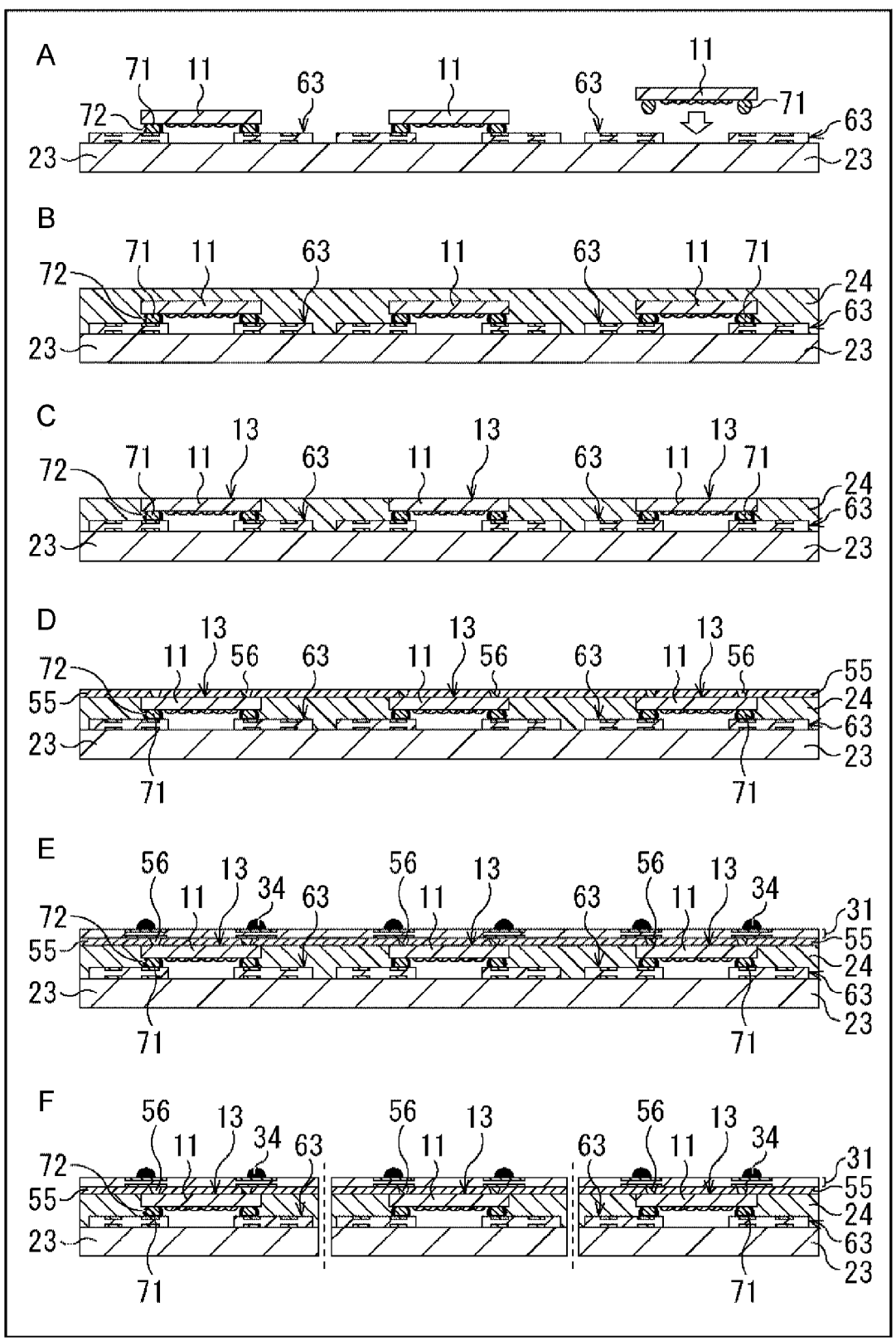
FIG. 18 is a set of views explaining a method for manufacturing the image sensor package of the fifth embodiment.

The steps in A to C of FIG. 18 are similar to the steps in A to C of FIG. 12.

First, as illustrated in A of FIG. 18, the singulated image sensors 11 with metal bumps 71 are each flip-chip bonded onto a metal wiring layer 61 of the glass substrate 23 on which the wiring layer 63 is formed, and thereafter, an underfill 72 is formed.

Next, as illustrated in B of FIG. 18, a surface of the glass substrate 23 on which the image sensors 11 are mounted is covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in C of FIG. 18, the second main surface 13 of each image sensor 11 is exposed by grinding the surface of the covering portion 24 thus formed by mechanical grinding, chemical mechanical polishing, or the like.

Next, as illustrated in D of FIG. 18, the entire surface including the exposed second main surface 13 of each image sensor 11 is covered with a predetermined covering material by a printing method, a coating method, a vapor deposition method, a lamination method, or the like, and thereby the covering portion 55 is formed. Since the surface to be re-covered is flat, a surface obtained after the re-covering can maintain flatness, as well.

Next, as illustrated in D of FIG. 18, the vias 56 are formed by forming openings in the surface covered with the covering portion 55, at positions where the TSVs 35 of the image sensors 11 are arranged, and then burying a metal material in each opening, forming a metal material conformal to each opening, or the like. The openings can be formed by, for example, wet etching, dry etching, mechanical drilling, laser drilling, or the like.

Thereafter, as illustrated in E of FIG. 18, the re-distribution layer 31 including the metal wiring layers 32 and the insulating layer 33, and the external terminals 34 are formed on a flat surface where the covering portion 55 and the vias 56 are formed. Then, as illustrated in F of FIG. 18, singulation is performed by dicing or the like utilizing a blade, laser, or the like, thereby completing the image sensor package 1 of the fifth embodiment illustrated in FIG. 17.

Also in the fifth manufacturing method, since the re-distribution layer 31 is formed on the glass substrate 23, extremely fine wiring processing can be achieved similarly to the other manufacturing methods described above.

6. Sixth Embodiment

<6.1 Structural View of Sixth Embodiment>

Figure 19:
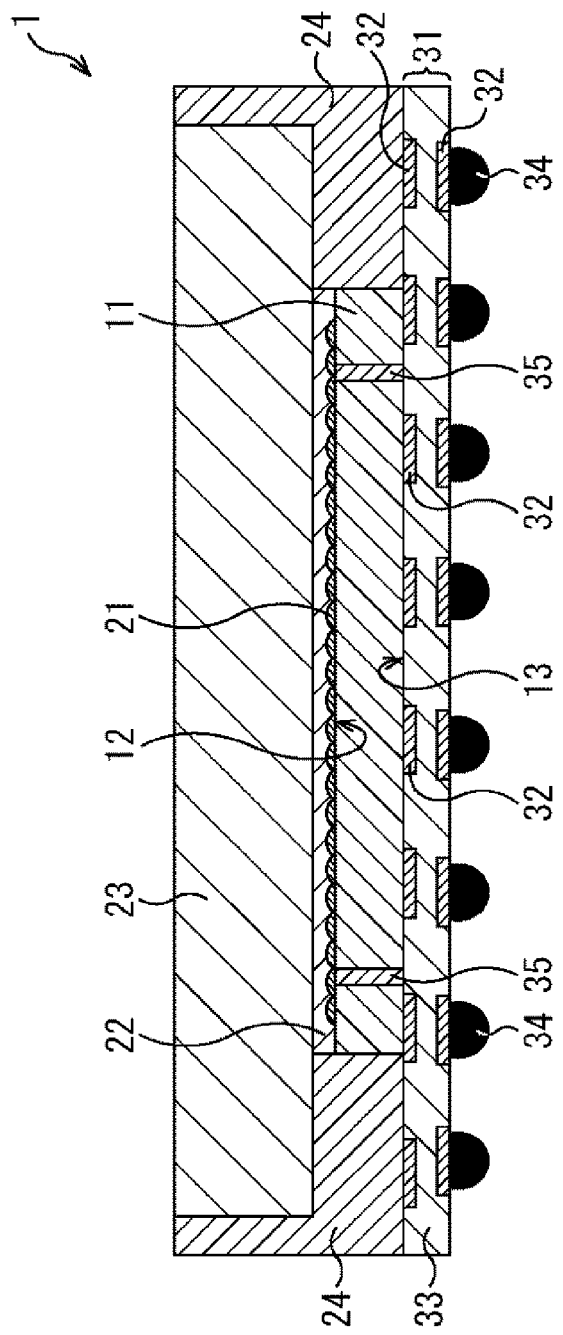
FIG. 19 is a cross-sectional view of an image sensor package as a sixth embodiment of a semiconductor device to which the present technology is applied.

FIG. 19 illustrates a cross-sectional view of an image sensor package as a sixth embodiment of a semiconductor device to which the present technology is applied.

In the image sensor package 1 of the sixth embodiment illustrated in FIG. 19, as compared with the first embodiment illustrated in FIG. 1, a difference therefrom resides in that a covering portion 24 is formed so as to cover not only side surfaces of an image sensor 11 but also side surfaces of a glass substrate 23. Other structures of the sixth embodiment are similar to those of the first embodiment illustrated in FIG. 1.

In the image sensor package 1 of the sixth embodiment, the covering portion 24 is formed so as to cover not only the side surfaces of the image sensor 11 but also the side surfaces of the glass substrate 23, and thereby end faces of both the image sensor 11 and the glass substrate 23 can be protected.

In addition, it is possible to prevent stray light entering or reflecting on the side surfaces of the glass substrate 23 and entering a light-receiving unit of the image sensor 11, and thereby a heat-dissipating path from the image sensor 11 can be formed.

Furthermore, similarly to the first embodiment, it is possible to cope with an increase in the number of I/Os of the image sensor 11, i.e. to provide more external terminals 34, by forming metal wiring layers 32 as fan-out wiring extending to an outer peripheral portion.

<6.2 Manufacturing Method of Sixth Embodiment>

Next, a manufacturing method (sixth manufacturing method) of the image sensor package 1 of the sixth embodiment will be described with reference to FIG. 20.

First, the image sensors 11 singulated from a semiconductor wafer are prepared. Then, as illustrated in A of FIG. 20, the singulated image sensors 11 are mounted on the glass substrate 23. Specifically, light transmissive members 22 are formed on the glass substrate 23, for example, by coating, and the singulated image sensors 11 are aligned on and adhered to the light transmissive members 22 in a pick-and-place manner so that light-receiving surfaces thereof face the glass substrate 23.

Figure 20:
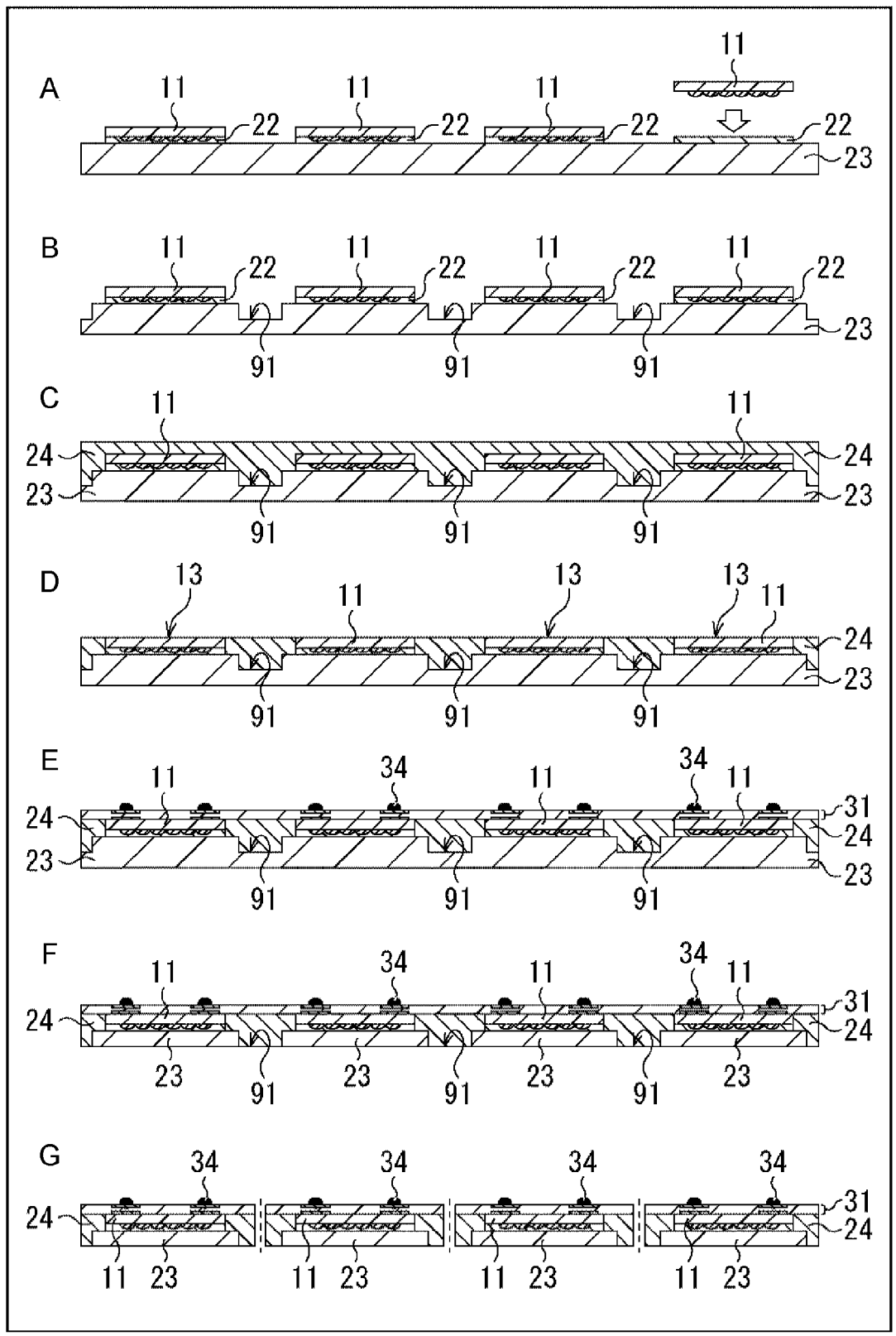
FIG. 20 is a set of views explaining a method for manufacturing the image sensor package of the sixth embodiment.

Next, as illustrated in B of FIG. 20, the glass substrate 23 between the aligned image sensors 11 is excavated to a predetermined depth, and thereby grooves 91 are formed. The width of each groove 91 is an arbitrary value of several tens of micrometers to several hundreds of micrometers and the depth thereof is an arbitrary value of several tens of micrometers or more.

Then, as illustrated in C of FIG. 20, upper surfaces of the glass substrate 23 including the grooves 91 and the image sensors 11 are covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in D of FIG. 20, the covering portion 24 is ground by mechanical grinding, chemical mechanical polishing, or the like, until the second main surface 13 of each image sensor 11 is exposed. The grinding may also serve to reduce the thickness of the image sensors 11.

Since there is no device circuit on the second main surface 13 of each image sensor 11, the grinding precision does not need to be very high. By the grinding, the covering portion 24 and the second main surface 13 of each image sensor 11 can be flattened, and TSVs 35 (not illustrated in FIG. 20) can be uniformly exposed. Thus, the connection between the TSVs 35 of the image sensor 11 and the metal wiring layers 32 can be fabricated with high accuracy.

Next, as illustrated in E of FIG. 20, a re-distribution layer 31 including the metal wiring layers 32 and the insulating layer 33, and the external terminals 34 are formed.

Subsequently, as illustrated in F of FIG. 20, the glass substrate 23 is thinned by HF slimming or the like until the glass substrate 23 is divided for each image sensor 11.

Finally, as illustrated in G of FIG. 20, singulation is performed by dicing or the like utilizing a blade, laser, or the like, thereby completing the image sensor package 1 of the sixth embodiment illustrated in FIG. 19.

The sixth manufacturing method described above is similar to the first manufacturing method described with reference to FIG. 3, except that the step of processing the grooves 91 illustrated in B of FIG. 20 and the step of thinning the glass substrate 23 illustrated in F of FIG. 20 are added.

<6.3 Variation of Sixth Embodiment>

In the step of thinning the glass substrate 23 illustrated in F of FIG. 20, the glass substrate 23 is thinned until the glass substrate 23 is divided for each image sensor 11. However, the thinning may not be necessarily performed to the extent that the glass substrate 23 is completely divided.

Figure 21:
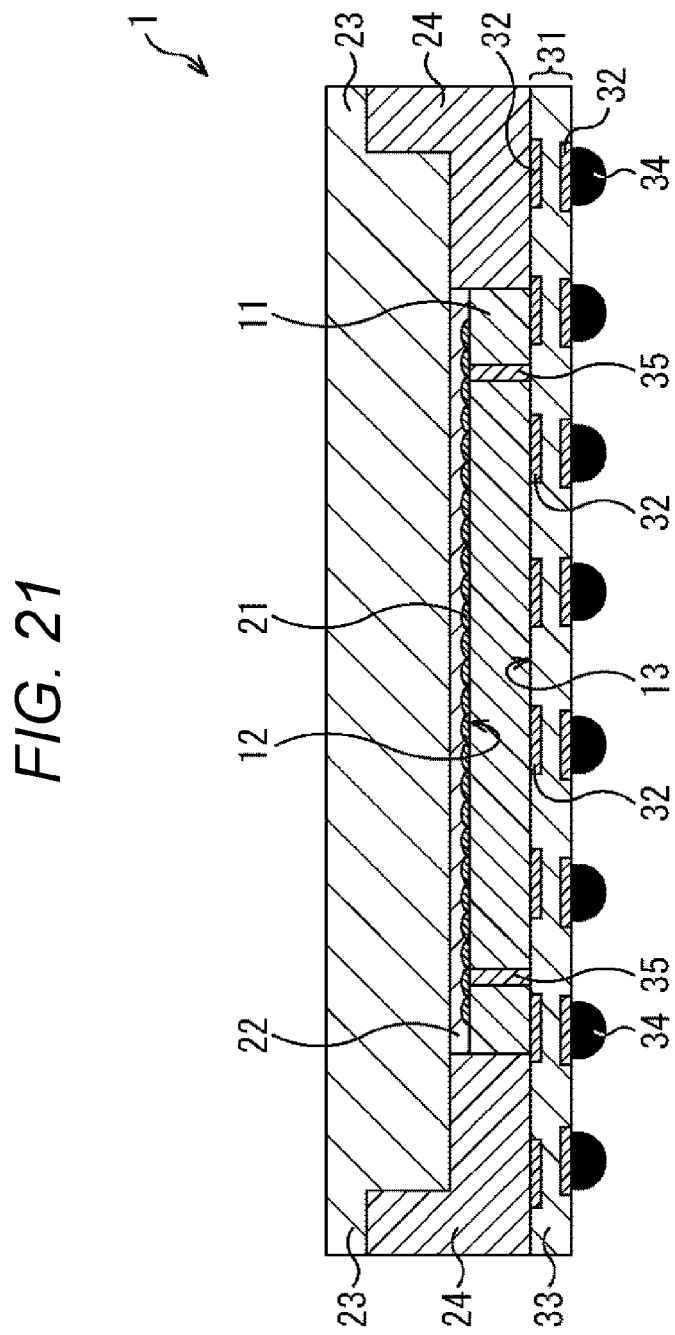
FIG. 21 is a cross-sectional view illustrating a variation of the sixth embodiment.

In that case, the glass substrate 23 remains with a predetermined thickness also in the grooves 91, and it is possible to manufacture the image sensor package 1 in which the glass substrate 23 is formed to be thinner in an end portion than in a portion above the image sensor 11 as illustrated in FIG. 21.

In a case where the glass substrate 23 is not completely divided in the step of thinning the glass substrate 23, there are advantages in each step after the thinning. For example, since the glass substrate 23 is not divided, the rigidity of the substrate can be maintained, and shrinkage of the substrate as a whole due to shrinkage of the covering portion 24 can be suppressed.

7. Seventh Embodiment

<7.1 Structural View of Seventh Embodiment>

Figure 22:
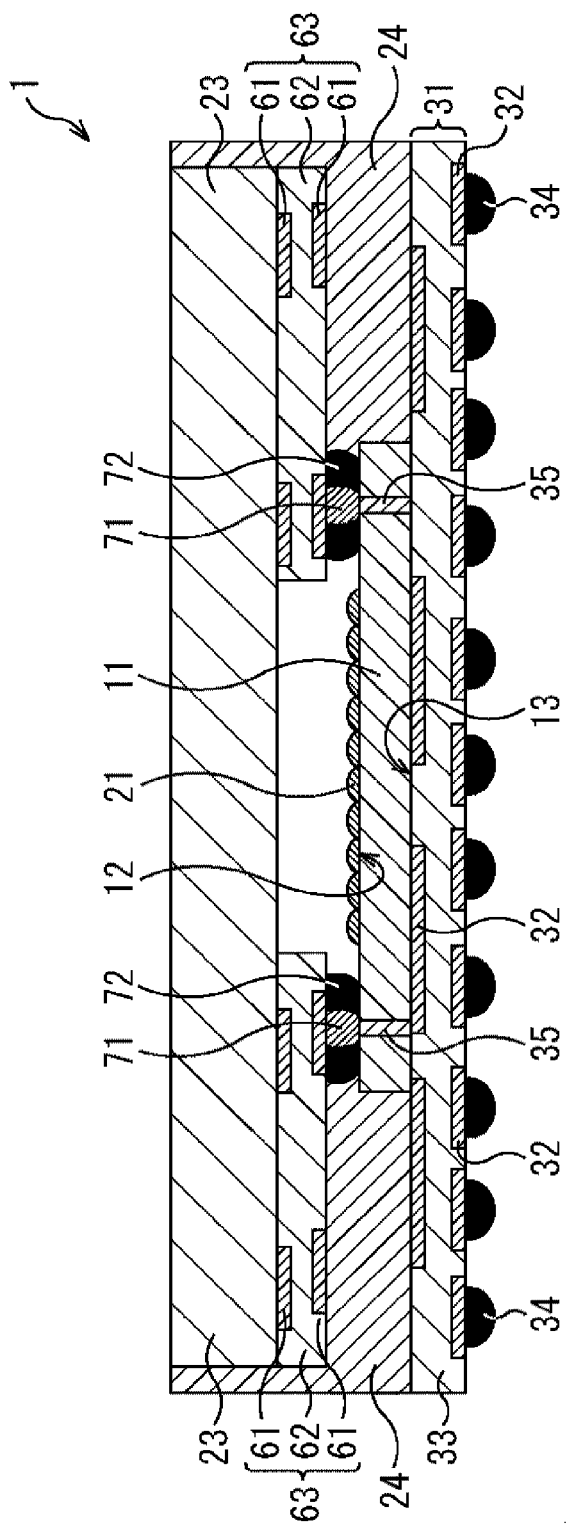
FIG. 22 is a cross-sectional view of an image sensor package as a seventh embodiment of a semiconductor device to which the present technology is applied.

FIG. 22 illustrates a cross-sectional view of an image sensor package as a seventh embodiment of a semiconductor device to which the present technology is applied.

In the image sensor package 1 of the seventh embodiment illustrated in FIG. 22, as compared with the fourth embodiment illustrated in FIG. 10, a difference therefrom resides in that a covering portion 24 is formed so as to cover not only side surfaces of an image sensor 11 but also side surfaces of a glass substrate 23. Other structures of the seventh embodiment are similar to those of the fourth embodiment illustrated in FIG. 10.

In the image sensor package 1 of the seventh embodiment, the covering portion 24 is formed so as to cover not only the side surfaces of the image sensor 11 but also the side surfaces of the glass substrate 23, and thereby end faces of both the image sensor 11 and the glass substrate 23 can be protected.

In addition, it is possible to prevent stray light entering or reflecting on the side surfaces of the glass substrate 23 and entering a light-receiving unit of the image sensor 11. A heat-dissipating path from the image sensor 11 can be formed, as well.

Furthermore, similarly to the first embodiment, it is possible to cope with an increase in the number of I/Os of the image sensor 11, i.e. to provide more external terminals 34, by forming metal wiring layers 32 as fan-out wiring extending to an outer peripheral portion.

<7.2 Manufacturing Method of Seventh Embodiment>

Next, a manufacturing method (seventh manufacturing method) of the image sensor package 1 of the seventh embodiment will be described with reference to FIG. 23.

Figure 23:
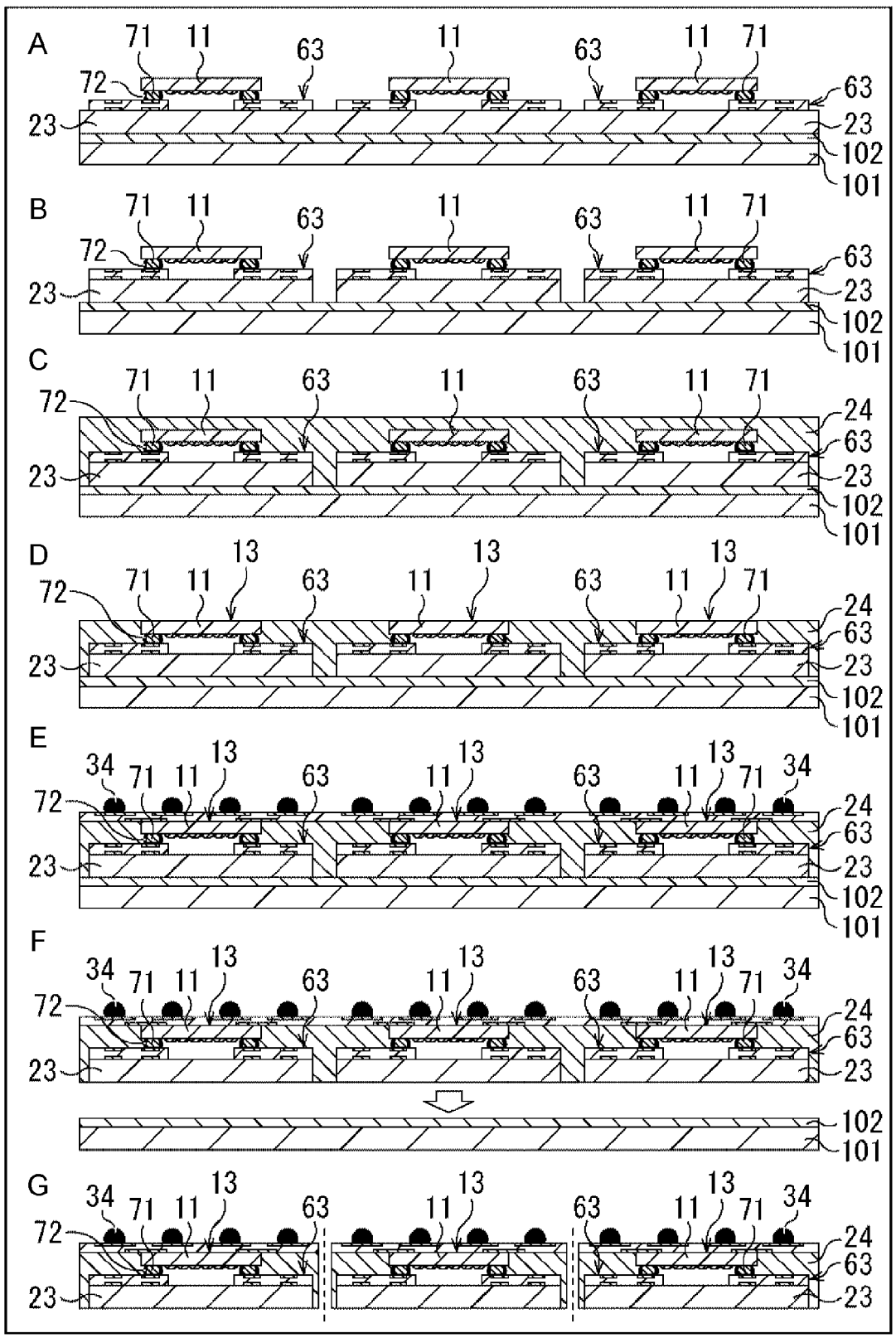
FIG. 23 is a set of views explaining a method for manufacturing the image sensor package of the seventh embodiment.

First, as illustrated in A of FIG. 23, similarly to the step in A of FIG. 12 described as the fourth manufacturing method, the glass substrate 23, to which the image sensors 11 with metal bumps 71 are flip chip bonded, is attached to a support material 101 via a releasable adhesive 102. Similarly to the carrier substrate 51 of FIG. 7, the support material 101 is constituted by, for example, a quartz substrate in a form of a wafer or a panel, a tape, or the like. For the adhesive 102, for example, an adhesive which can be released by irradiation with ultraviolet rays (UV) can be used.

Next, as illustrated in B of FIG. 23, the glass substrate 23 between the aligned image sensors 11 is excavated to a predetermined depth, and the glass substrate 23 is divided for each image sensor 11.

In a cutting step of the glass substrate 23, since the support material 101 is present as illustrated in B of FIG. 23, handling as a single wafer or a panel is possible even if the glass substrate 23 is completely divided, which enables collective processing thereafter. Thus, as in the sixth manufacturing method described with reference to FIG. 20, it is possible to divide the glass substrate 23 without performing the step of thinning the glass substrate 23 and to cover the side surfaces of each glass substrate 23. In addition, by using, for example, a material having high dimensional stability against heat, moisture, or the like such as a quartz substrate as the support material 101, warping of each glass substrate 23 in the covering step and the like can be reduced.

The following respective steps illustrated in C to E of FIG. 23 are similar to the respective steps illustrated in B to D of FIG. 12.

That is, as illustrated in C of FIG. 23, a surface of each glass substrate 23 on which the image sensor 11 is mounted is covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in D of FIG. 23, the second main surface 13 of the image sensor 11 is exposed by grinding the surface of the covering portion 24 thus formed by mechanical grinding, chemical mechanical polishing or the like.

Next, as illustrated in E of FIG. 23, a re-distribution layer 31 including the metal wiring layers 32 and the insulating layer 33, and the external terminals 34 are formed.

Then, as illustrated in F of FIG. 23, the support material 101 adhered with the adhesive 102 is released, and as illustrated in G of FIG. 23, singulation is performed by dicing or the like utilizing a blade, laser, or the like, thereby completing the image sensor package 1 of the seventh embodiment illustrated in FIG. 22.

Note that the image sensor package 1 of the seventh embodiment can be manufactured also by a method in which the groove processing step and the thinning step are performed for the glass substrate 23 as in the sixth manufacturing method described with reference to FIG. 20.

8. Eighth Embodiment

<8.1 Structural View of Eighth Embodiment>

Figure 24:
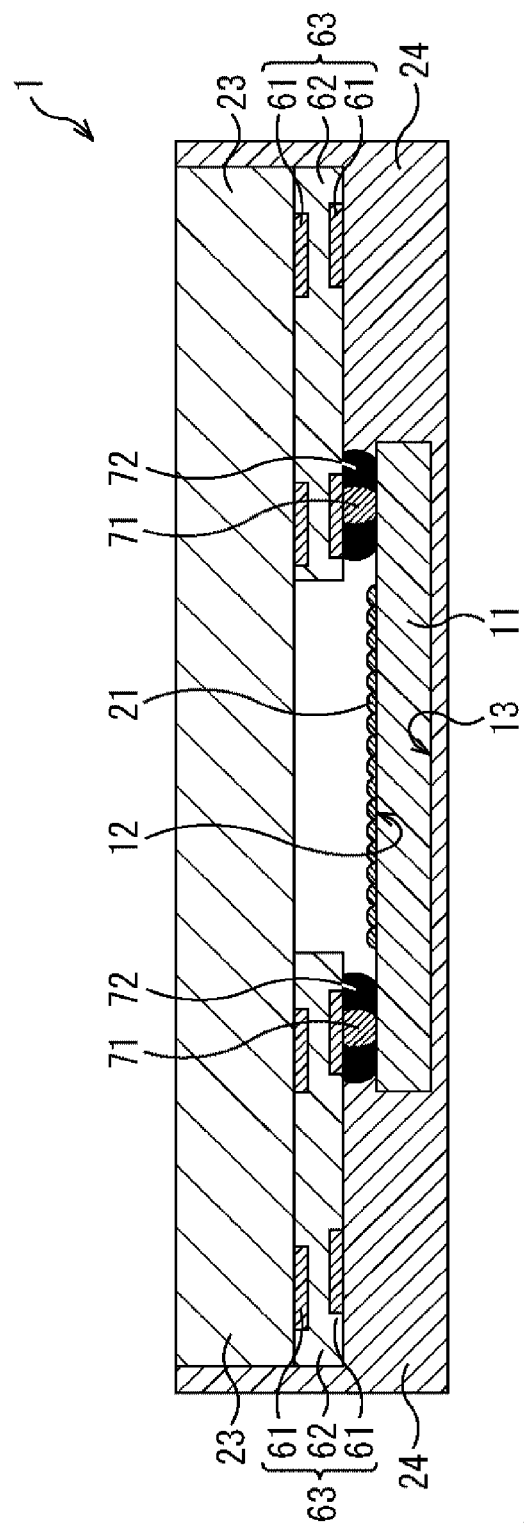
FIG. 24 is a cross-sectional view of an image sensor package as an eighth embodiment of a semiconductor device to which the present technology is applied.

FIG. 24 illustrates a cross-sectional view of an image sensor package as an eighth embodiment of a semiconductor device to which the present technology is applied.

In the image sensor package 1 of the eighth embodiment illustrated in FIG. 24, as compared with the fourth embodiment illustrated in FIG. 10, the re-distribution layer 31 and the external terminals 34 on the side of the second main surface 13 of the image sensor 11 are replaced with a covering portion 24. In other words, in the eighth embodiment, the covering portion 24 is formed so as to cover a rear surface in addition to side surfaces of an image sensor 11. In addition, the covering portion 24 is formed so as to cover side surfaces of a glass substrate 23, as well. Other structures of the eighth embodiment are similar to those of the fourth embodiment illustrated in FIG. 10.

In a case of adopting the structure of FIG. 24, the external terminals can be arranged on an upper surface of the glass substrate 23, on a lower surface (rear surface) of the image sensor package 1, or the like. The external terminals arranged on the upper surface of the glass substrate 23 are each electrically connected to the image sensor 11 via, for example, a through glass via (TGV, not illustrated) penetrating the glass substrate 23 and a wiring layer 63. The external terminals arranged on the lower surface of the image sensor package 1 are each electrically connected to the image sensor 11 via a through mold via (TMV, not illustrated) penetrating the covering portion 24.

In the eighth embodiment, unlike the first to seventh embodiments described above, the re-distribution layer 31 using fan-out wiring is not formed on the rear surface of the image sensor 11. Instead, the rear surface of the image sensor 11 is also covered with the covering portion 24, so that more heat-dissipating paths from the image sensor 11 are secured.

In addition, by forming the covering portion 24 so as to cover the side surfaces and the rear surface of the image sensor 11 and the side surfaces of the glass substrate 23, it is possible to absorb stray light, and thereby to prevent unintended light from entering an image sensor light-receiving unit. Examples of the stray light include stray light entering from outside through the rear surface of the image sensor 11, the side surfaces of the glass substrate 23, or the like, and stray light occurring as a result that received incident light, while being totally reflected on the surface of the glass substrate 23, is transmitted to a side surface, is reflected on the side surface, and reaches a light-receiving unit of the image sensor 11 while repeating the total reflection again.

Furthermore, since the covering portion 24 is formed so as to cover the side surfaces of the image sensor 11 and the glass substrate 23, it is possible to protect end faces of both the image sensor 11 and the glass substrate 23.

<8.2 Manufacturing Method of Eighth Embodiment>

Next, a manufacturing method (eighth manufacturing method) of the image sensor package 1 of the eighth embodiment will be described with reference to FIG. 25.

Figure 25:
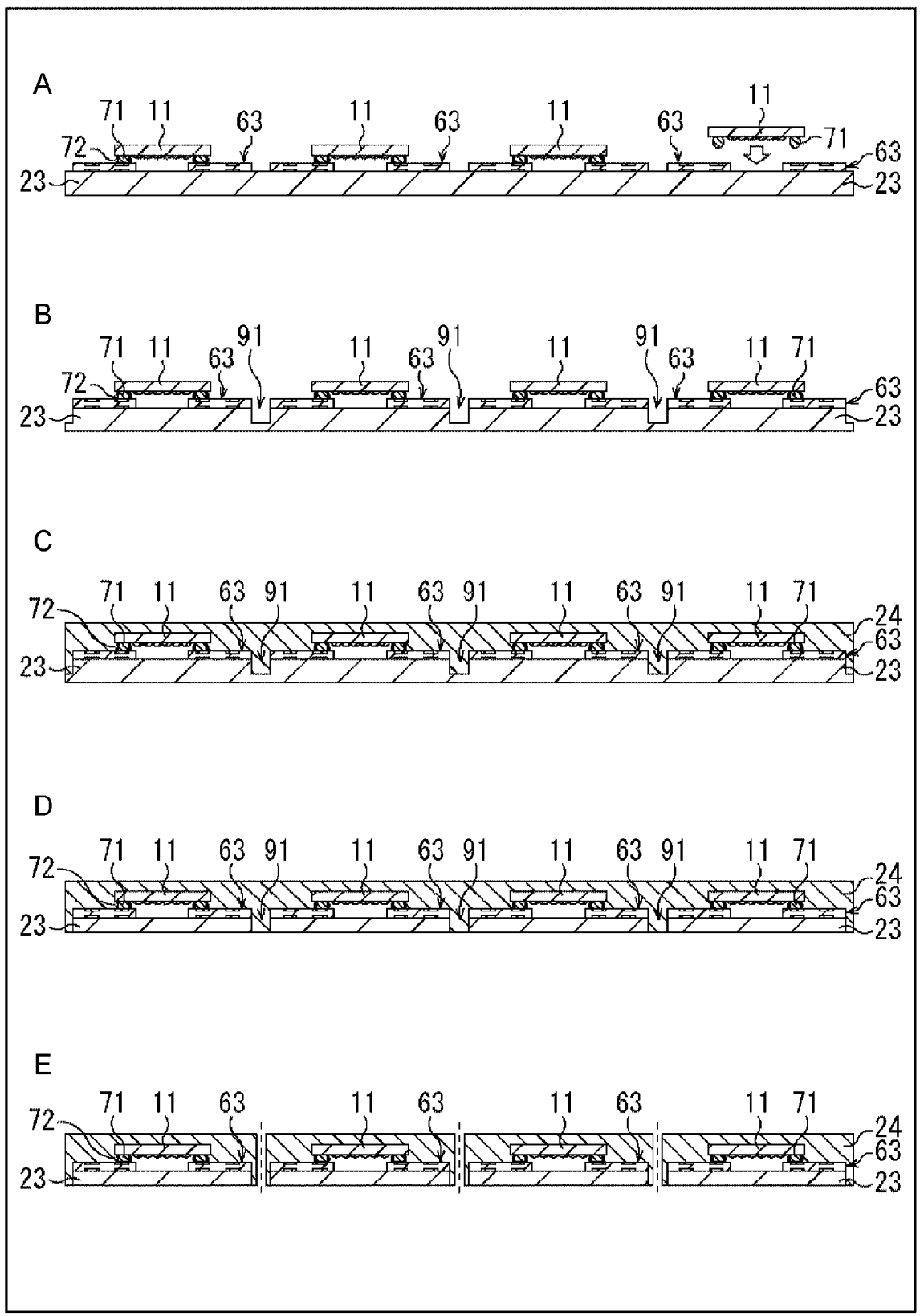
FIG. 25 is a set of views explaining a method for manufacturing the image sensor package of the eighth embodiment.

First, as illustrated in A of FIG. 25, the singulated image sensors 11 with metal bumps 71 are each flip-chip bonded onto a metal wiring layer 61 of the glass substrate 23 on which the wiring layer 63 is formed, and thereafter, an underfill 72 is formed.

Next, as illustrated in B of FIG. 25, the glass substrate 23 between the aligned image sensors 11 is excavated to a predetermined depth, and thereby grooves 91 are formed.

The width of each groove 91 is an arbitrary value of several tens of micrometers to several hundreds of micrometers and the depth thereof is an arbitrary value of several tens of micrometers or more.

Then, as illustrated in C of FIG. 25, upper surfaces of the glass substrate 23 including the grooves 91 and the wiring layers 63 and the image sensors 11 are covered with a predetermined covering material by a printing method, a coating method, a lamination method, a molding method, or the like, and thereby the covering portion 24 is formed. As the covering material, for example, a common epoxy-type molding material for semiconductor packaging applications or the like can be used.

Subsequently, as illustrated in D of FIG. 25, the glass substrate 23 is thinned by HF slimming or the like until the glass substrate 23 is divided for each image sensor 11.

Finally, as illustrated in E of FIG. 25, singulation is performed by dicing or the like utilizing a blade, laser, or the like, thereby completing the image sensor package 1 of the eighth embodiment illustrated in FIG. 24.

<8.3 First Variation of Eighth Embodiment>

In the step of thinning the glass substrate 23 illustrated in D of FIG. 25, the glass substrate 23 is thinned until the glass substrate 23 is divided for each image sensor 11.

Figure 26:
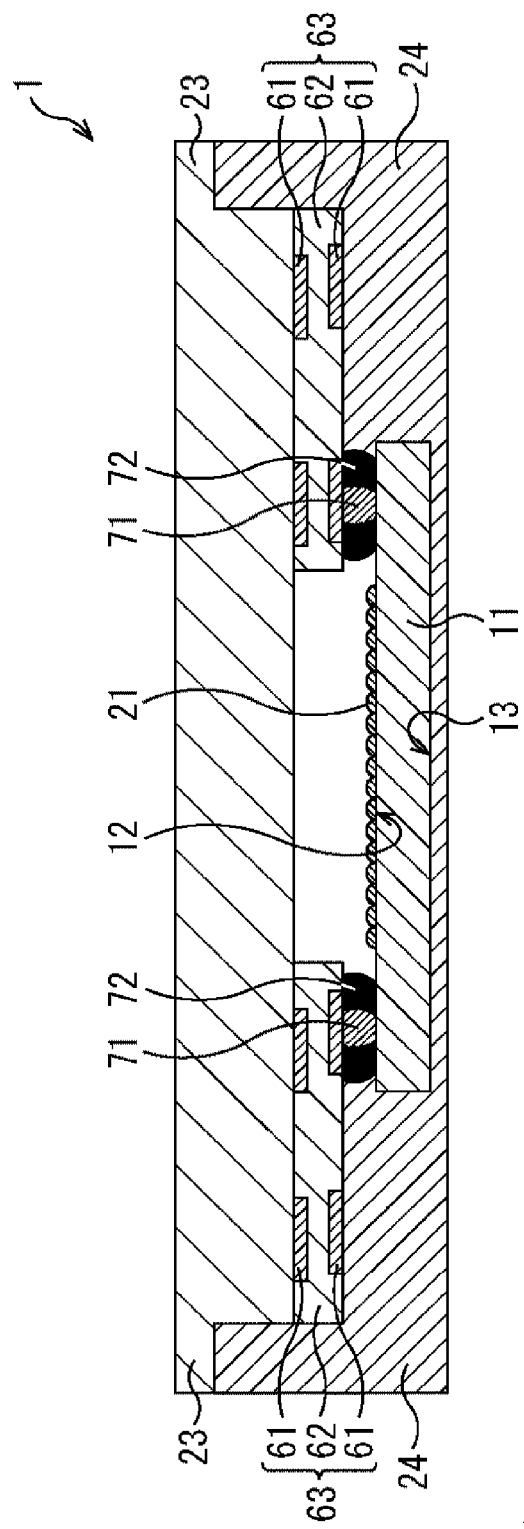
FIG. 26 is a cross-sectional view illustrating a first variation of the eighth embodiment.

However, the thinning may not be necessarily performed to the extent that the glass substrate 23 is completely divided. In that case, the glass substrate 23 remains also in the grooves 91 with a predetermined thickness, and it is possible to manufacture an image sensor package 1 in which the glass substrate 23 is formed to be thinner in an end portion than in a portion above the image sensor 11 as illustrated in FIG. 26.

In a case where the glass substrate 23 is not completely divided in the step of thinning the glass substrate 23, there are advantages in each step after the thinning. For example, since the glass substrate 23 is not divided, the rigidity of the substrate can be maintained, and shrinkage of the substrate as a whole due to shrinkage of the covering portion 24 can be suppressed.

<8.4 Second Variation of Eighth Embodiment>

Figure 27:
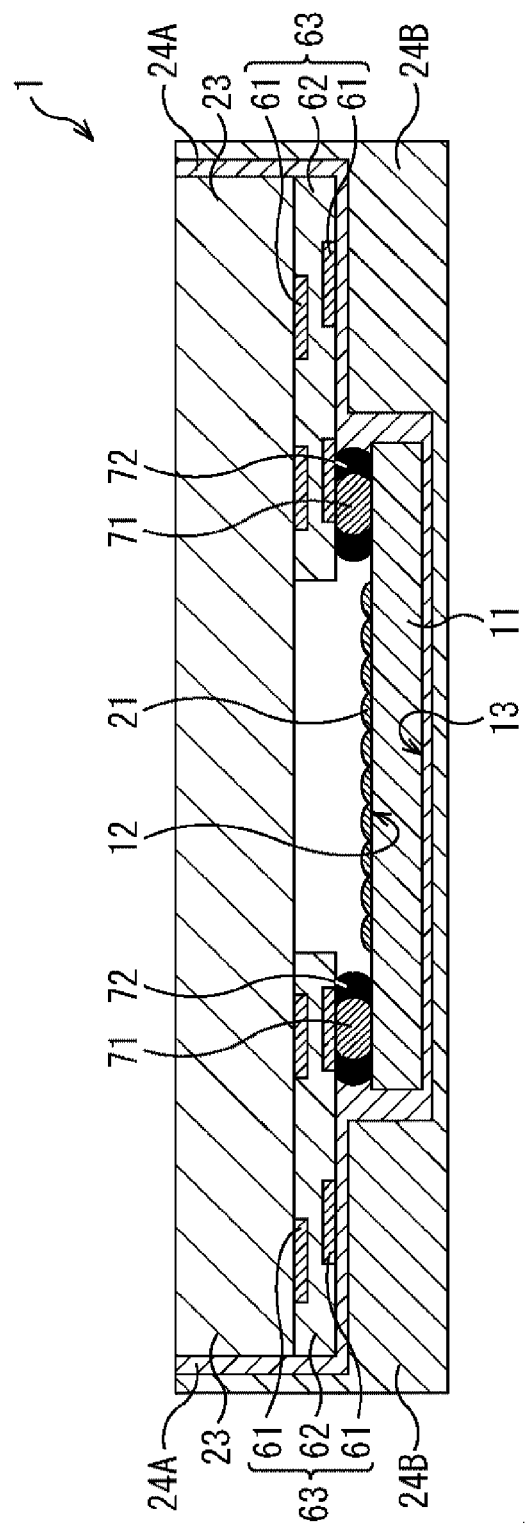
FIG. 27 is a cross-sectional view illustrating a second variation of the eighth embodiment.

FIG. 27 is a cross-sectional view of an image sensor package 1 illustrating a second variation of the eighth embodiment.

In the second variation of the eighth embodiment illustrated in FIG. 27, a difference from the eighth embodiment illustrated in FIG. 24 resides in that the covering portion 24 which covers the side surfaces of the image sensor 11 and the glass substrate 23 is replaced by two types of covering portions 24A and 24B.

Of the two types of covering portions 24A and 24B, the covering portion 24A in contact with the image sensor 11 includes a light-blocking material having a transmittance of light ranging from visible light to near infrared light of 10% or less. On the other hand, the covering portion 24B includes a heat-dissipating material having a thermal conductivity of 0.5 W/m·K or more.

These two types of covering portions 24A and 24B can be formed as follows. In the step of forming the covering portion 24 illustrated in C of FIG. 25, first, covering is performed with a light-blocking material serving as the covering portion 24A by a printing method, a coating method, a vapor deposition method, a lamination method, a molding method, or the like, and then covering is performed with a heat-dissipating material serving as the covering portion 24B by a similar method.

In this way, by using the light-blocking material as the covering portion 24A in contact with the image sensor 11, it is possible to absorb stray light entering from the side surfaces of the image sensor 11 and a lower surface of the glass substrate 23 and to prevent unintended light from entering the light-receiving unit of the image sensor 11.

In addition, it is possible to form a heat dissipation path for dissipating heat generated from the image sensor 11 by using the heat-dissipating material as the covering portion 24B located outside the covering portion 24A.

Note that the covering portion 24 may be constituted by three types of covering materials, and it is sufficient for the covering portion 24 to be a structure where covering is performed with one or more types of covering materials.

9. Configuration Example of Multi-Chip Module

Figure 28:
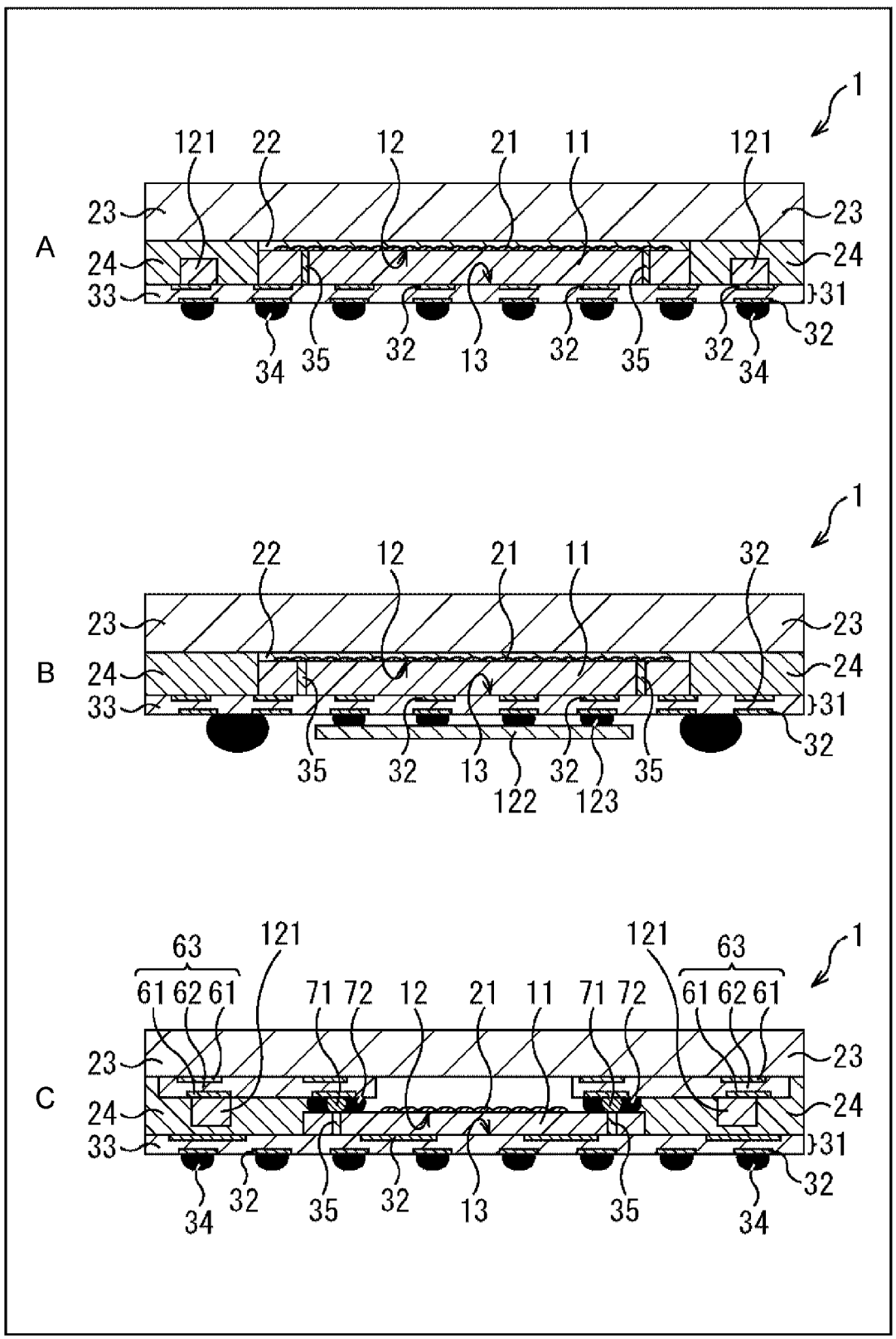
FIG. 28 is a set of cross-sectional views of an image sensor package having a multi-chip module structure.

FIG. 28 illustrates a configuration example of an image sensor package in which the image sensor package 1 further includes a chip component such as a resistor, a capacitor, or a transistor, as a component, and thus has a multi-chip module structure.

A of FIG. 28 illustrates an example of the image sensor package 1 in which one or more chip components 121 are arranged on a part of the covering portion 24 in the first embodiment illustrated in FIG. 1. The chip component 121 is constituted by, for example, a passive component such as a resistor, a capacitor, or a coil, or an active component such as a transistor. Each chip component 121 is electrically connected to the metal wiring layer 32 of the re-distribution layer 31 and exchanges a predetermined signal with the image sensor 11 via the re-distribution layer 31.

B of FIG. 28 illustrates an example of the image sensor package 1 in which a chip component 122 is further arranged on a lower surface of the re-distribution layer 31 in the first embodiment illustrated in FIG. 1. The chip component 122 is electrically connected to the metal wiring layers 32 of the re-distribution layer 31 via metal bumps 123 and exchanges a predetermined signal with the image sensor 11 via the re-distribution layer 31. The external terminals 34 are formed so as to be higher than the combined height of the chip component 122 and the metal bump 123.

C of FIG. 28 illustrates an example of the image sensor package 1 in which one or more chip components 121 are arranged on a part of the covering portion 24 in the fourth embodiment illustrated in FIG. 10. Each chip component 121 is electrically connected to the metal wiring layer 61 of the wiring layer 63 and exchanges a predetermined signal with the image sensor 11 via the wiring layer 63.

Similarly, in the image sensor package 1 of each of the above-described embodiments and variations thereof other than those illustrated in A to C of FIG. 28, it is possible to mount one or more chip components to form a multi-chip module.

As described above, regarding the image sensor package 1, downsizing of the device can be achieved by mounting one or more chip components in the same package to form a multi-chip module. In addition, aggregation of the chip components makes it possible to shorten signal paths between the components and to achieve high-speed signal processing.

10. Configuration Example of Camera Module

Figure 29:
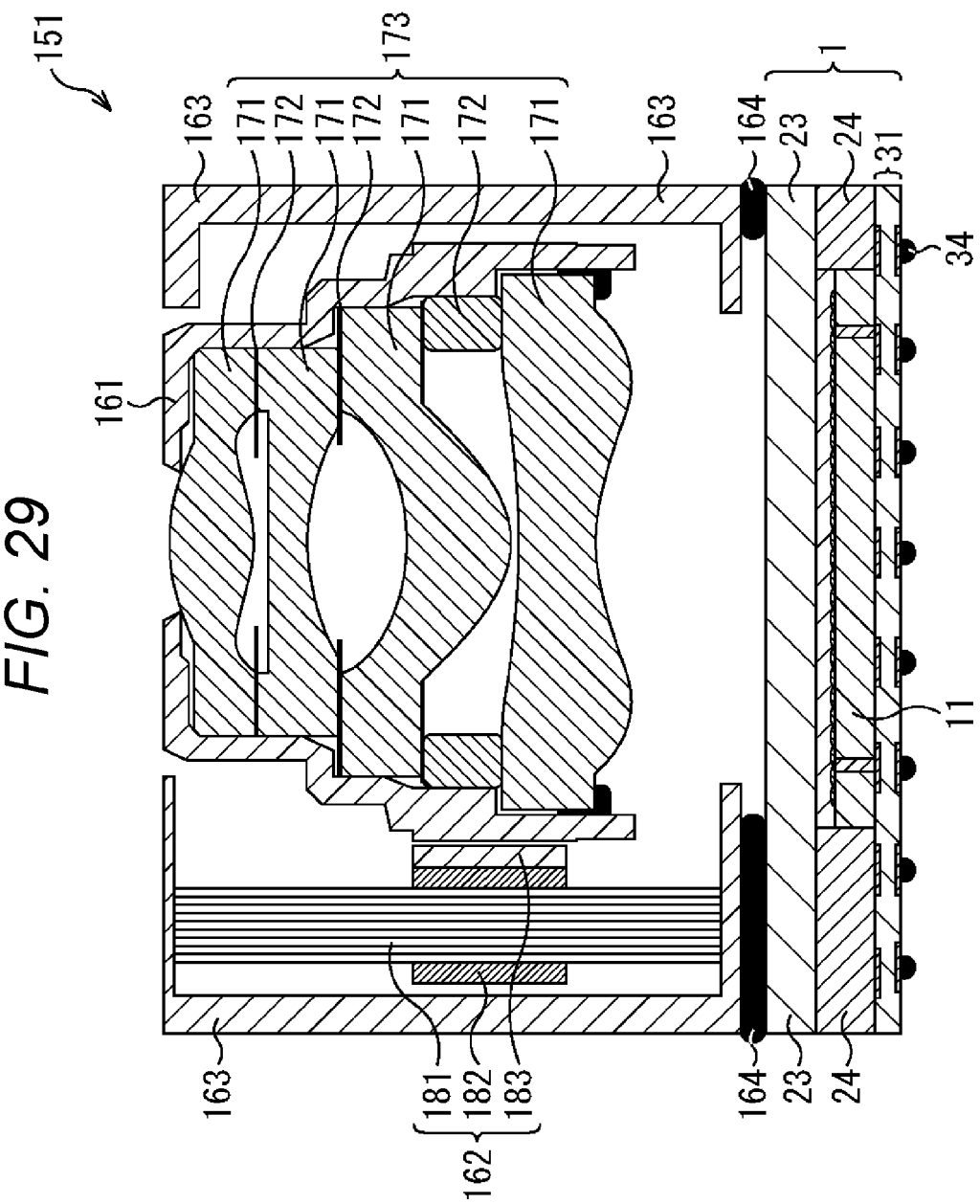
FIG. 29 is a cross-sectional view illustrating a configuration example of a camera module.

FIG. 29 illustrates a configuration example of a camera module in which a lens structure is assembled to the image sensor package of each of the above-described embodiments.

The camera module 151 of FIG. 29 includes the image sensor package 1 of the first embodiment described above, a lens barrel 161, a driving unit 162 which moves the lens barrel 161 in an optical axis direction, and a housing 163 which accommodates the lens barrel 161 and the driving unit 162.

The lens structure 173 in which multiple lenses 171 are stacked via spacers 172 is fixed to the lens barrel 161. Light concentrated by the multiple lenses 171 is incident on the image sensor 11 of the image sensor package 1. In FIG. 29, the lens structure 173 is constituted by four lenses 171, but the number of lenses 171 is not limited thereto.

The driving unit 162 includes a driving motor (not illustrated), a shaft 181, a moving member 182 which moves in an axial direction of the shaft 181, and a fixing member 183 which fixes the moving member 182 and the lens barrel 161. The driving unit 162 moves the lens barrel 161 in the optical axis direction in accordance with auto focus control. The housing 163 is fixed to the glass substrate 23 of the image sensor package 1 with an adhesive 164.

In the image sensor package 1 of each of the embodiments described above, since the size of the glass substrate 23 can be made larger than the chip size of the image sensor 11, the flat and hardly deflectable glass substrate 23 can be employed as a reference surface used when attaching the housing 163 into which the lens structure 173 has been incorporated, and thus it becomes possible to facilitate optical axis alignment.

In addition, the structure in which the image sensor chip is mounted on the glass substrate 23 also contributes to suppress deflection of the sensor chip.

Regarding the image sensor package 1, a large number of external terminals 34 can be arranged by using fan-out wiring extending to the range of the glass substrate 23 which is larger than the chip size of the image sensor 11, which makes it possible to disperse and relieve stress applied to the external terminals 34 when the housing 163 into which the lens structure 173 has been incorporated is attached thereto to form the camera module 151.

11. Configuration Examples of Multi-Ocular Camera Module

Next, configuration examples of a multi-ocular camera module will be described.

<11.1 First Configuration Example of Multi-Ocular Camera Module>

Figure 30:
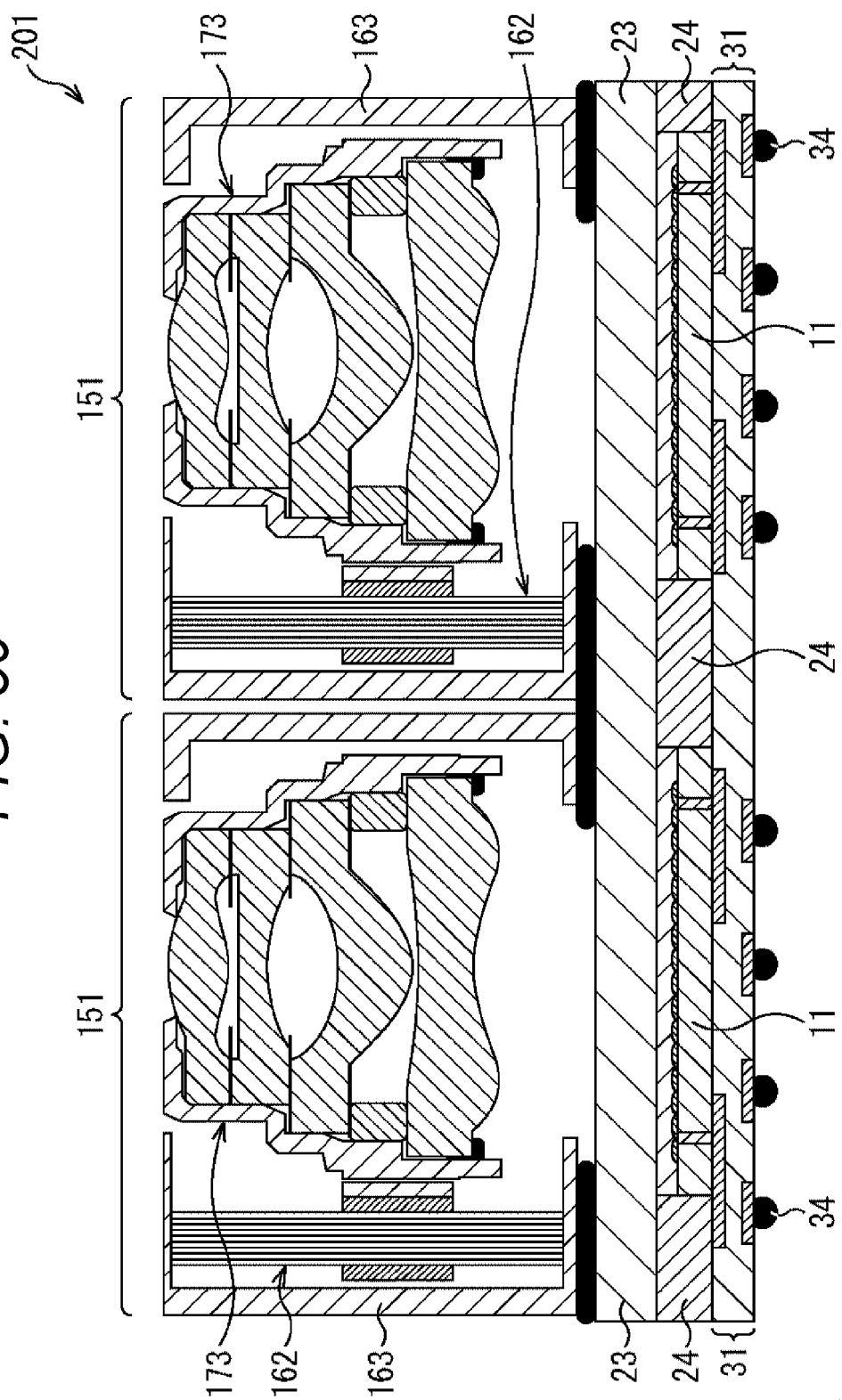
FIG. 30 is a cross-sectional view illustrating a first configuration example of a multi-ocular camera module.

FIG. 30 illustrates a first configuration example of the multi-ocular camera module.

The multi-ocular camera module 201 of FIG. 30 has a configuration in which one package includes two camera modules 151 of FIG. 29. Accordingly, the multi-ocular camera module 201 includes a plurality of lens structures 173 and a plurality of image sensors 11.

Two image sensor packages 1 used for the multi-ocular camera module 201 are obtained, for example, by performing singulation in a unit of two image sensor packages 1 in the singulation step in the first manufacturing method described with reference to FIG. 3.

<11.2 Second Configuration Example of Multi-Ocular Camera Module>

Figure 31:
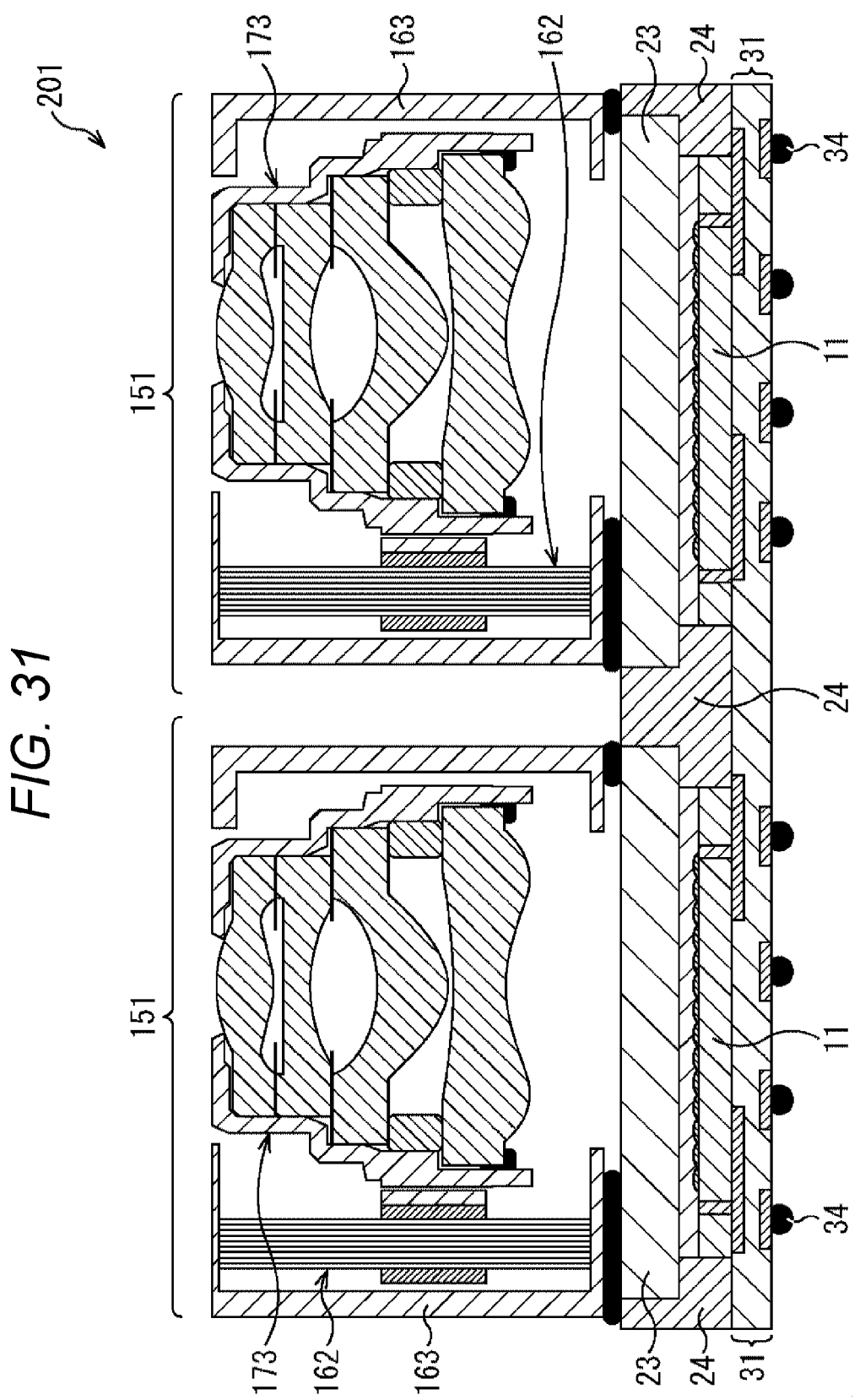
FIG. 31 is a cross-sectional view illustrating a second configuration example of the multi-ocular camera module.

FIG. 31 illustrates a second configuration example of the multi-ocular camera module.

The multi-ocular camera module 201 of FIG. 31 is similar to the first configuration example in that the multi-ocular camera module 201 is constituted by two camera modules 151, but is different therefrom in that the glass substrate 23 is divided for each camera module 151. The covering portion 24 is arranged between the glass substrates 23 arranged for each camera module 151. Thus, side surfaces of the glass substrates 23 can be covered with the covering portion 24, and accordingly, stray light transmitted while being totally reflected inside the glass substrate 23 and entering unintentionally from the adjacent image sensor package 1 can be absorbed by the covering portion 24 and thereby prevented.

<11.3 Third Configuration Example of Multi-Ocular Camera Module>

Figure 32:
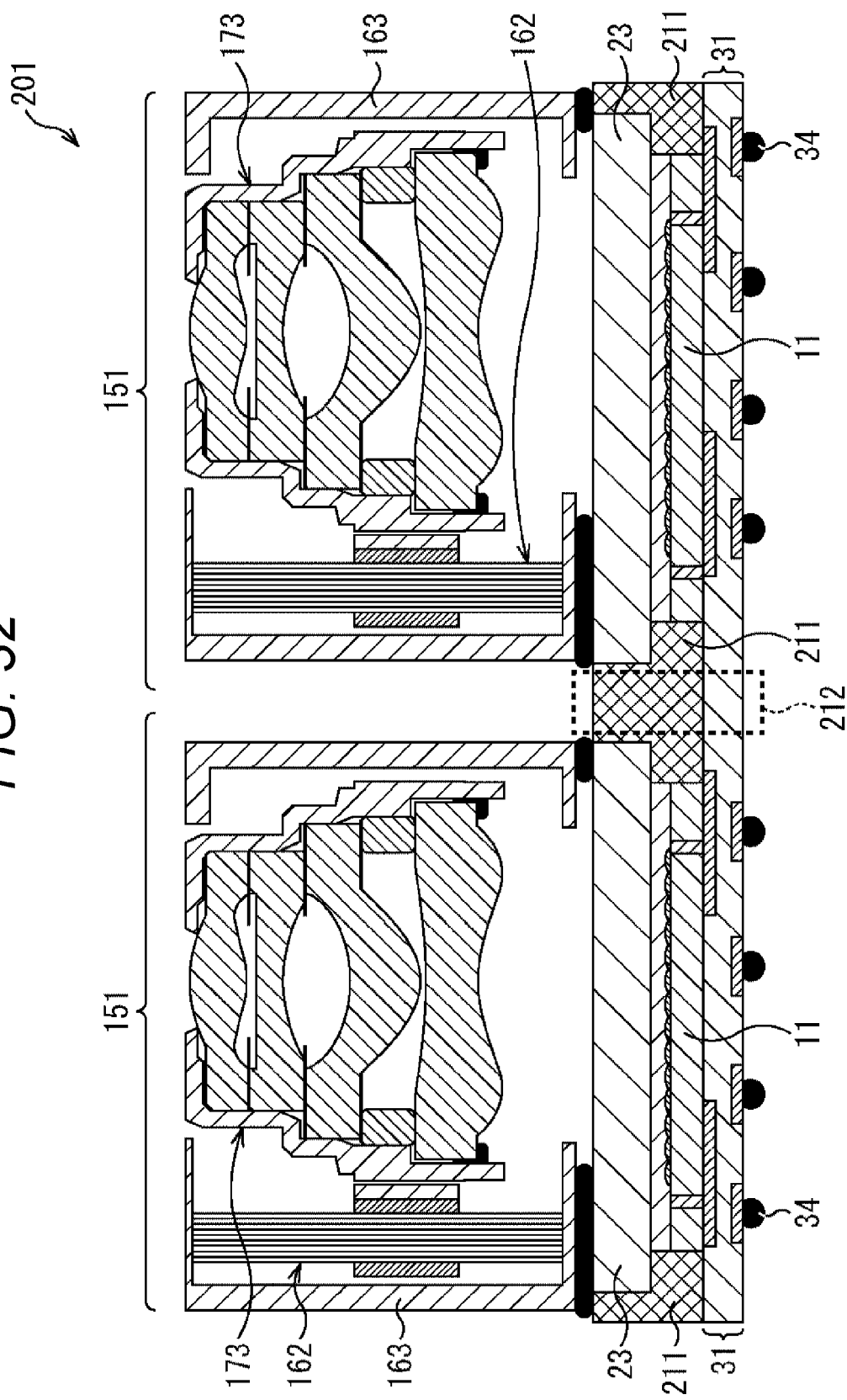
FIG. 32 is a cross-sectional view illustrating a third configuration example of the multi-ocular camera module.

FIG. 32 illustrates a third configuration example of the multi-ocular camera module.

The multi-ocular camera module 201 of FIG. 32 is similar to the second configuration example in that the multi-ocular camera module 201 is constituted by two camera modules 151 of which the glass substrates 23 are divided from each other, but is different therefrom in that the covering portion 24 which covers the side surfaces of the glass substrates 23 and the side surfaces of the image sensors 11 is replaced by a covering portion 211.

The covering portion 211 is constituted by a bendable flexible material. Thus, the two camera modules 151 can be bent at a bending portion 212. Note that the re-distribution layer 31 is connected also in the bending portion 212, and therefore, a material excellent in repeated bending resistance such as polyimide, for example, is used for the insulating layer 33 of the re-distribution layer 31.

Even in a case where the two camera modules 151 are bent at the bending portion 212, each of the image sensors 11 of the camera modules 151 is held by the glass substrate 23 having high rigidity, so that warping and bend of the image sensors 11 can be prevented.

<11.4 Fourth Configuration Example of Multi-Ocular Camera Module>

Figure 33:
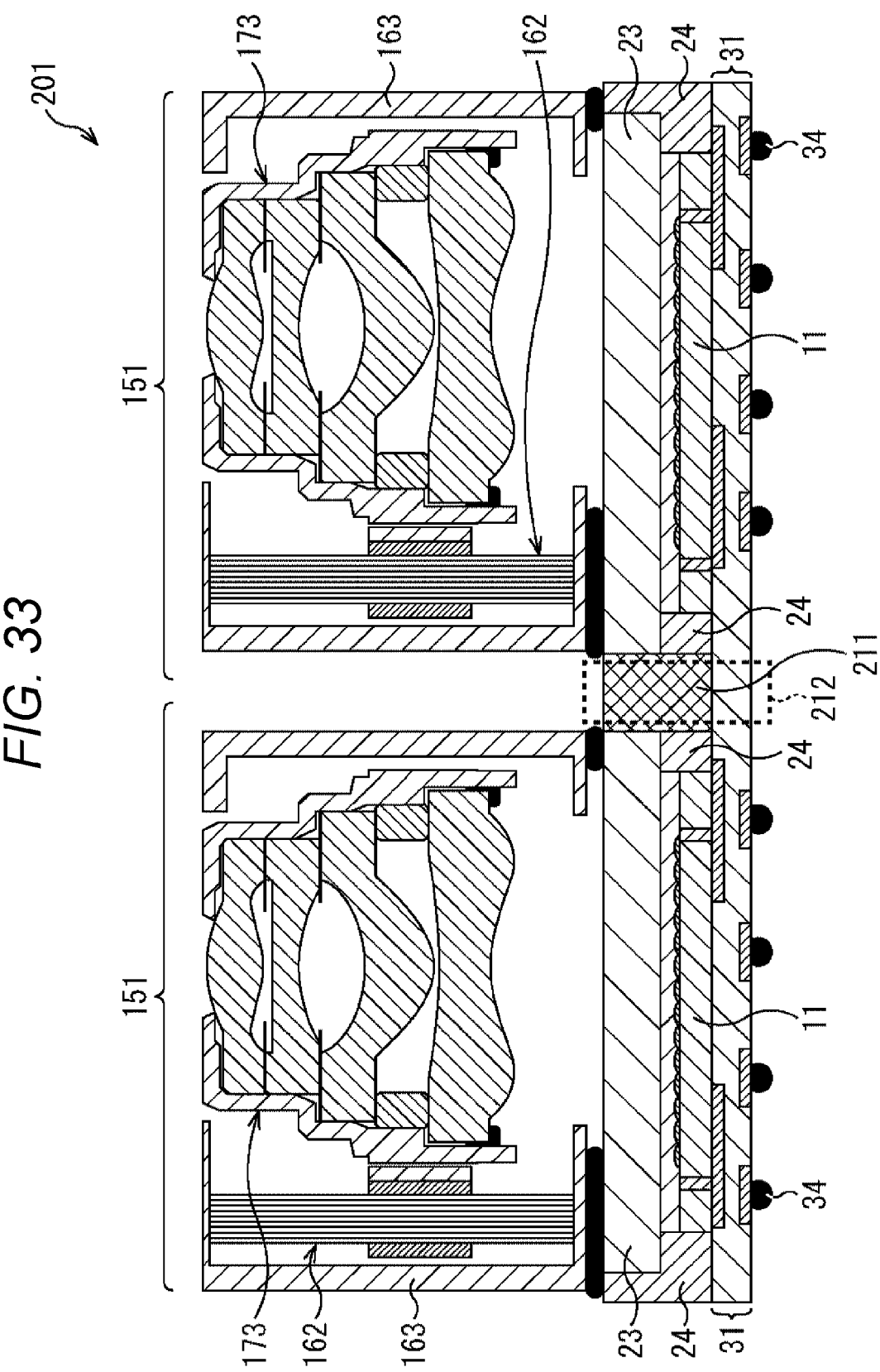
FIG. 33 is a cross-sectional view illustrating a fourth configuration example of the multi-ocular camera module.

FIG. 33 illustrates a fourth configuration example of the multi-ocular camera module.

The multi-ocular camera module 201 of FIG. 33 is similar to the second and third configuration examples in that the multi-ocular camera module 201 is constituted by two camera modules 151 of which the glass substrates 23 are divided from each other, but is different therefrom in that the covering portion 24 using a light-blocking material or a heat-dissipating material is arranged on the side surfaces of the glass substrates 23 and the side surfaces of the image sensors 11, and the covering portion 211 using a flexible material is arranged only in the bending portion 212.

Also in the fourth configuration example, the two camera modules 151 can be bent at the bending portion 212. On the other hand, warping and bend of each of the image sensors 11 of the camera modules 151 can be prevented by the glass substrate 23 having high rigidity.

<11.5 Fifth Configuration Example of Multi-Ocular Camera Module>

Figure 34:
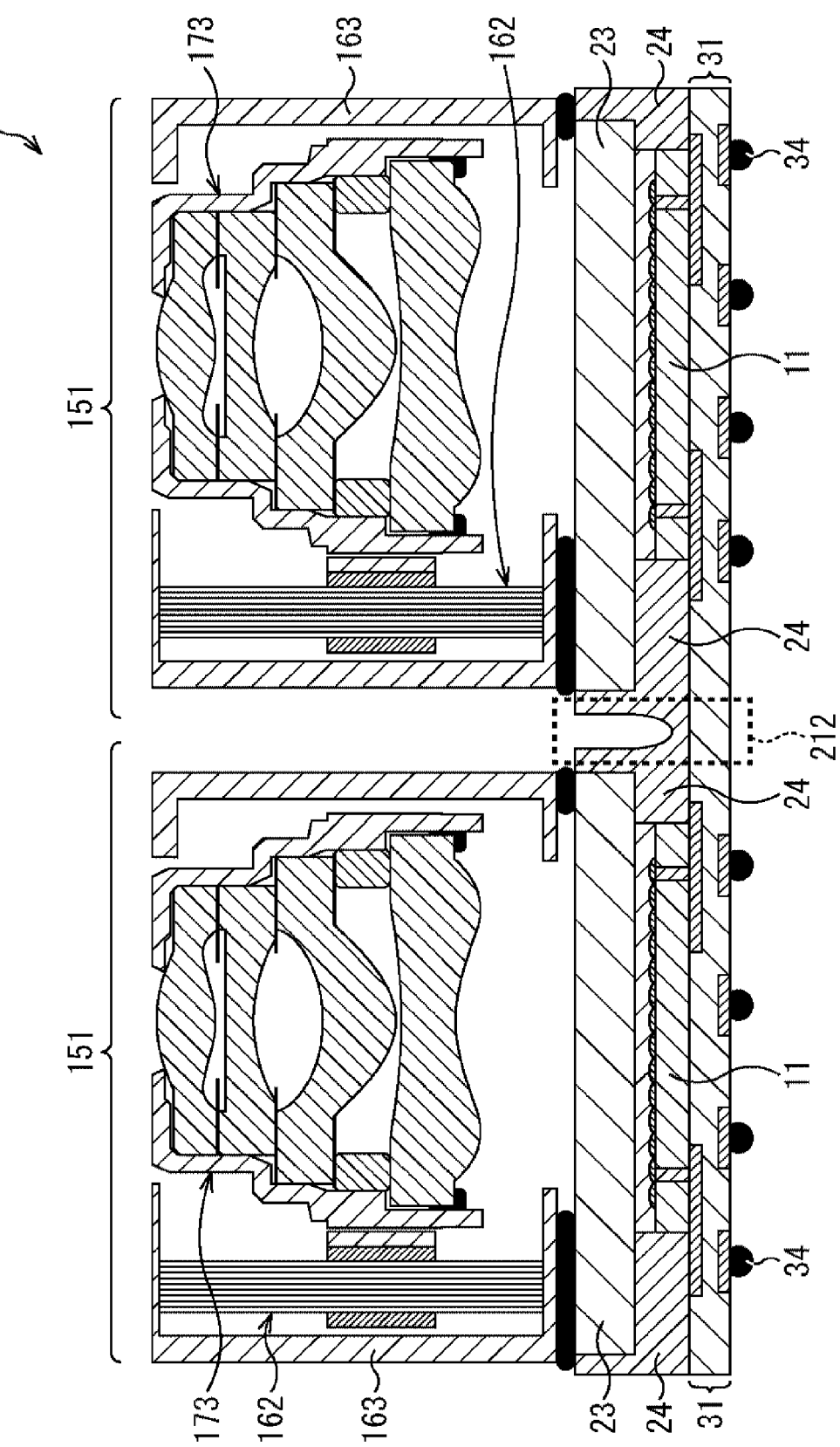
FIG. 34 is a cross-sectional view illustrating a fifth configuration example of the multi-ocular camera module.

FIG. 34 illustrates a fifth configuration example of the multi-ocular camera module.

The multi-ocular camera module 201 of FIG. 34 is similar to the second to fourth configuration examples in that the multi-ocular camera module 201 is constituted by two camera modules 151 of which the glass substrates 23 are divided from each other, but is different therefrom in that the covering portion 24 formed on the side surfaces of the glass substrates 23 and the side surfaces of the image sensors 11 is formed to be thin in the bending portion 212.

With the covering portion 24 of the bending portion 212 thus formed to be thin, it is possible to bend the two camera modules 151 at the bending portion 212. On the other hand, warping and bend of each of the image sensors 11 of the camera modules 151 can be prevented by the glass substrate 23 having high rigidity.

According to each configuration of the multi-ocular camera module 201 described above, signals between multiple image sensors 11 can be connected via a short signal path within the same multi-ocular camera module 201, so that high-speed signal processing can be performed.

Note that the multi-ocular camera module 201 of the present disclosure refers to a camera module which includes a plurality of lens structures 173 having a common optical axis, and in which the plurality of lens structures 173 and one or more image sensor packages 1 (image sensors 11) are formed integrally with each other.

Figure 35:
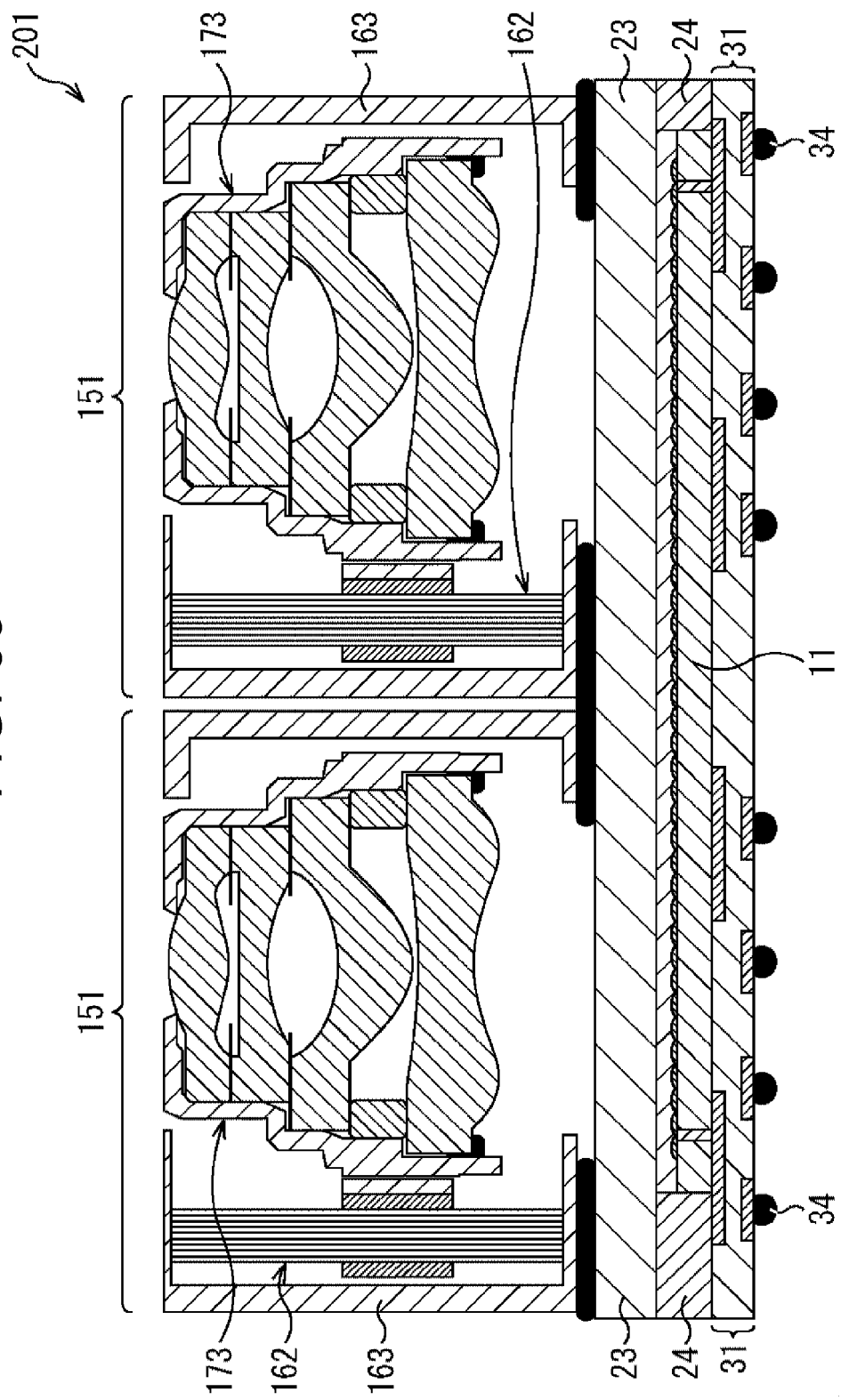
FIG. 35 is a cross-sectional view illustrating a sixth configuration example of the multi-ocular camera module.

Therefore, the multi-ocular camera module 201 includes, in addition to those in which the number of lens structures 173 and the number of image sensor packages 1 are the same as in the first to fifth configuration examples described above, those in which the number of lens structures 173 is different from the number of image sensor packages 1 as illustrated in FIG. 35, for example.

FIG. 35 illustrates a sixth configuration example of the multi-ocular camera module.

The multi-ocular camera module 201 of FIG. 35 is constituted by two lens structures 173 and one image sensor package 1, and the configuration of any one of the first to seventh embodiments described above is adopted for the image sensor package 1.

12. Examples of Application to Electronic Apparatuses

The image sensor package 1, the camera module 151, or the multi-ocular camera module 201 described above can be used after being incorporated into an electronic apparatus which uses a solid-state imaging apparatus for an image capturing unit (photoelectric conversion unit), for example, an imaging device such as a digital still camera or a video camera, a mobile terminal device having an imaging function, or a copying machine using a solid-state imaging apparatus for an image reading unit.

Figure 36:
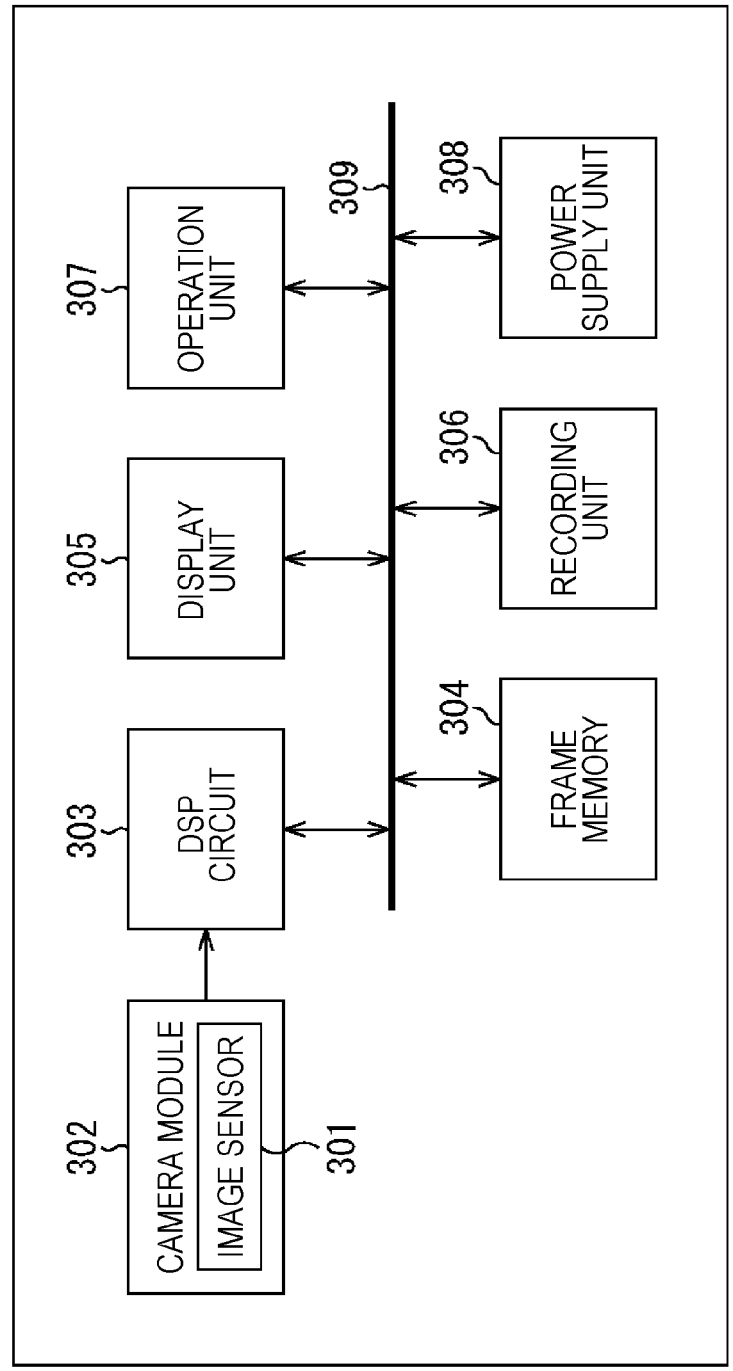
FIG. 36 is a block diagram illustrating a configuration example of an imaging apparatus as an electronic apparatus to which the present technology is applied.

FIG. 36 is a block diagram illustrating a configuration example of an imaging apparatus as an electronic apparatus to which the present technology is applied.

The imaging apparatus 300 of FIG. 36 includes a camera module 302 and a digital signal processor (DSP) circuit 303 which is a camera signal processing circuit. In addition, the imaging apparatus 300 also includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are interconnected via a bus line 309.

An image sensor 301 in the camera module 302 captures incident light (image light) from a subject, converts intensity of incident light focused on an imaging surface into electric signals on a pixel-by-pixel basis, and outputs the electric signals as pixel signals. As the camera module 302, the camera module 151 or the multi-ocular camera module 201 is adopted, and the image sensor 301 corresponds to the image sensor 11 of FIG. 1. Note that a configuration in which the image sensor package 1 of each of the above-described embodiments is combined with an arbitrary lens structure may be adopted instead of the camera module 302.

The display unit 305 is, for example, a panel-type display device such as a liquid crystal panel, or an organic electroluminescence (EL) panel, and displays a moving image or a still image picked up by the image sensor 301. The recording unit 306 records a moving image or a still image picked up by the image sensor 301 on a recording medium such as a hard disk or a semiconductor memory.

The operation unit 307 issues operation commands for various functions of the imaging apparatus 300 under operations of a user. The power supply unit 308 appropriately supplies various types of power serving as operation power of the DSP circuit 303, the frame memory 304, the display unit 305, the recording unit 306, and the operation unit 307, to these targets to be supplied.

As described above, higher image quality and downsizing can be achieved by using the image sensor package 1 coping with an increase in the number of I/Os of the image sensor 11 as the camera module 302. In addition, by using the image sensor package 1 in which the covering portion 24 which covers the side surfaces of the image sensor 11 or the glass substrate 23 is formed, it is possible to prevent unintended light from entering the light-receiving unit of the image sensor 11, and to form a heat-dissipating path for dissipating heat generated from the image sensor 11.

Therefore, also in the imaging apparatus 300 such as a video camera, a digital still camera, or a camera module for a mobile device such as a cellular phone, it is possible to achieve both of downsizing of a semiconductor package and higher image quality of a picked up image.

<Examples of Use of Image Sensor>

Figure 37:
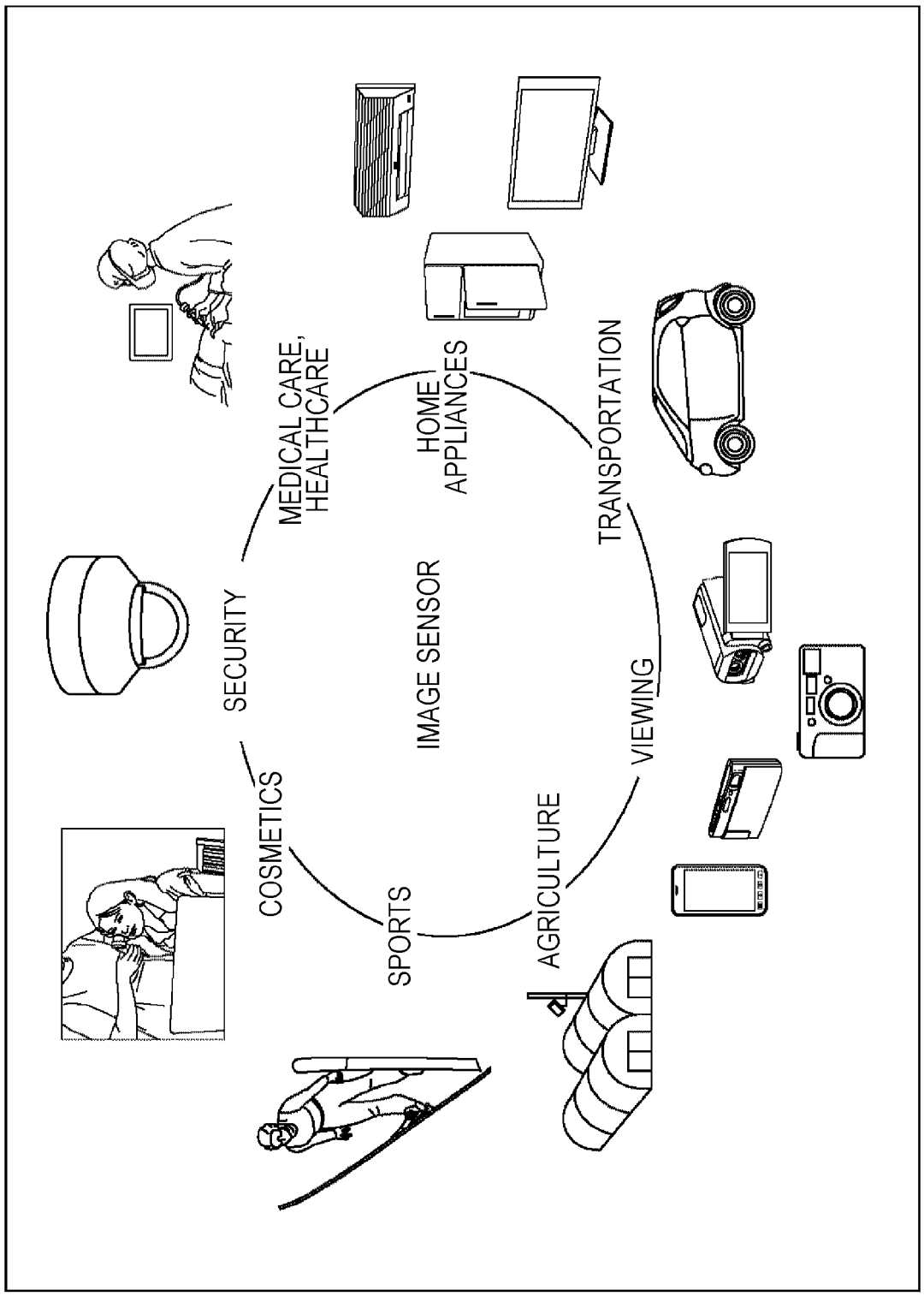
FIG. 37 is a diagram explaining examples of use of an image sensor.

FIG. 37 is a diagram illustrating examples of use of an image sensor configured as the image sensor package 1, the camera module 151, or the multi-ocular camera module 201.

The image sensor configured as the image sensor package 1, the camera module 151, or the multi-ocular camera module 201 can be used, for example, in various cases of sensing light such as visible light, infrared light, ultraviolet light, and X-rays, as follows.

Apparatuses which shoot images to be used for viewing, such as a digital camera and a portable device with a camera function Apparatuses for use in transportation such as an on-vehicle sensor which shoots images of the front, rear, surroundings, inside, and the like of an automobile for the purpose of safe driving such as automatic stop, recognition of driver's conditions, and the like, a surveillance camera which monitors traveling vehicles and roads, a distance measuring sensor which measures distance between vehicles, and the like Apparatuses provided for home appliances such as TV, a refrigerator, and an air conditioner, in order to shoot an image of a user's gesture and to operate an appliance according to the gesture Apparatuses for use in medical care or healthcare, such as an endoscope and a device for performing angiography by receiving infrared light Apparatuses for use in security such as a security surveillance camera and a camera for personal authentication Apparatuses for use in cosmetics such as a skin measuring instrument which shoots an image of the skin and a microscope which shoots an image of the scalp Apparatuses for use in sports and the like such as an action camera and a wearable camera for sports applications Apparatuses for use in agriculture, such as a camera for monitoring conditions of fields and crops Embodiments of the present technology are not limited to the embodiments described above. Various variations may be made without departing from the gist of the present technology.

For example, the present technology is not limited to application to a solid-state imaging apparatus which detects distribution of incident light intensities of visible light and picks up the distribution as an image, and the present technology can be applied to a solid-state imaging apparatus which picks up distribution of amounts of incident infrared rays, X-rays, particles or the like as an image, and, as a broad meaning, a solid-state imaging apparatus (physical quantity distribution detection apparatus) in general such as a fingerprint detection sensor which detects distribution of other physical quantities such as pressure and electrostatic capacitance, and picks up the distribution as an image.

For example, it is possible to adopt a mode in which all or a part of the above-described multiple embodiments are combined.

Note that the effects described herein are merely examples and are not limited, and there may be effects other than those described herein.

Note that the present technology may have the following configurations.

(1)

A semiconductor device including:

an image sensor in which photoelectric conversion elements are formed on a semiconductor substrate;

a glass substrate arranged on a first main surface side of the image sensor;

a first wiring layer formed on a second main surface side opposite to the first main surface of the image sensor; and external terminals each of which outputs a signal of the image sensor to outside, in which metal wiring of the first wiring layer is formed so as to extend from inside to an outer peripheral portion of the image sensor and is connected to each of the external terminals.

(2)

A semiconductor device including:

an image sensor in which photoelectric conversion elements are formed on a semiconductor substrate;

a glass substrate which protects a first main surface which is a light-receiving surface of the image sensor; and an insulating member which covers side surfaces of the image sensor and the glass substrate.

(3)

The semiconductor device according to (1) or (2), in which a planar region where the first wiring layer is formed is larger than a planar region of the image sensor.

(4)

The semiconductor device according to any one of (1) to (3), in which between the glass substrate and the first wiring layer, side surfaces of the image sensor are covered with an insulating material.

(5)

The semiconductor device according to (4), in which the insulating material includes two types of insulating materials which are a light-blocking material and a material having high thermal conductivity.

(6)

The semiconductor device according to any one of (1) to (5), in which a second wiring layer is inserted between the first main surface of the image sensor and the glass substrate.

(7)

The semiconductor device according to any one of (1) to (6), in which side surfaces of the glass substrate are covered with an insulating material.

(8)

The semiconductor device according to any one of (1) to (7), in which a light transmissive member is enclosed between the first main surface of the image sensor and the glass substrate.

(9)

The semiconductor device according to any one of (1) to (8), in which air is enclosed between the first main surface of the image sensor and the glass substrate.

(10)

The semiconductor device according to any one of (1), and (3) to (9), in which one or more types of insulating materials are inserted between the second main surface of the image sensor and the first wiring layer.

(11)

The semiconductor device according to (10), in which an electrode unit on the second main surface of the image sensor and the first wiring layer are electrically connected via a metal bump.

(12)

The semiconductor device according to (10), in which an electrode unit on the second main surface of the image sensor and the first wiring layer are electrically connected via a via.

(13)

The semiconductor device according to any one of (1), and (3) to (12), in which the glass substrate is formed to be thicker in an outer peripheral portion than in the inside thereof.

(14)

The semiconductor device according to any one of (1), and (3) to (13), further including a lens structure in which a plurality of lenses is stacked, in which the semiconductor device is configured such that light concentrated by the plurality of lenses is incident on the image sensor.

(15)

The semiconductor device according to (2), in which a second main surface opposite to the first main surface of the image sensor is also covered with the insulating member.

(16)

A method for manufacturing a semiconductor device, the method including:

arranging a glass substrate on a first main surface side of an image sensor in which photoelectric conversion elements are formed on a semiconductor substrate;

forming a wiring layer which includes metal wiring extending from inside to an outer peripheral portion of the image sensor on a second main surface side opposite to the first main surface of the image sensor; and forming the external terminals to be connected to the metal wiring.

(17)

An electronic apparatus including a semiconductor device, the semiconductor device including:

an image sensor in which photoelectric conversion elements are formed on a semiconductor substrate;

a glass substrate arranged on a first main surface side of the image sensor;

a wiring layer formed on a second main surface side opposite to the first main surface of the image sensor; and external terminals each of which outputs a signal of the image sensor to outside, in which metal wiring of the wiring layer is formed so as to extend from inside to an outer peripheral portion of the image sensor and is connected to each of the external terminals.

(18)

An electronic apparatus including:

a semiconductor device, the semiconductor device including:

an image sensor in which photoelectric conversion elements are formed on a semiconductor substrate;

a glass substrate which protects a light-receiving surface of the image sensor; and an insulating member which covers side surfaces of the image sensor and the glass substrate.

REFERENCE SIGNS LIST

1 Image sensor package
11 Image sensor
12 First main surface
13 Second main surface
21 On-chip lens
22 Light transmissive member
23 Glass substrate
24, 24A, 24B Covering portion
31 Re-distribution layer
32 Metal wiring layer
33 Insulating layer
34 External terminal
41 Metal bump
55 Covering portion
56 Via
61 Metal wiring layer
62 Insulating layer
63 Wiring layer
121, 122 Chip component
151 Camera module
171 Lens
173 Lens structure
201 Multi-ocular camera module
212 Bending portion
300 Imaging apparatus
301 Image sensor
302 Camera module

What is claimed is:

1. A semiconductor device comprising:
an image sensor in which photoelectric conversion elements are formed on a semiconductor substrate;
a glass substrate arranged on a first main surface of the image sensor, wherein the glass substrate is formed to be thicker in an outer peripheral portion than in an inside portion thereof;
a first wiring layer formed on a second main surface opposite to the first main surface of the image sensor, wherein between the glass substrate and the first wiring layer, side surfaces of the image sensor are covered with an insulating material, and wherein the insulating material is thinner in the outer peripheral portion where the glass substrate is thicker; and
a plurality of external terminals,
wherein metal wiring of the first wiring layer includes a plurality of electrode units formed in a region of the image sensor and a plurality of wiring elements, wherein each wiring element of the plurality of wiring elements extends between a respective electrode unit of the plurality of electrode units and a respective external terminal of the plurality of external terminals.

2. The semiconductor device according to claim 1, wherein a planar region where the first wiring layer is formed is larger than a planar region of the image sensor.

3. The semiconductor device according to claim 1, wherein the insulating material includes two types of insulating materials that are a light-blocking material and a material having high thermal conductivity.

4. The semiconductor device according to claim 1, wherein a second wiring layer is inserted between the first main surface of the image sensor and the glass substrate.

5. The semiconductor device according to claim 1, wherein side surfaces of the glass substrate are covered with an insulating material.

6. The semiconductor device according to claim 1, wherein a light transmissive member is enclosed between the first main surface of the image sensor and the glass substrate.

7. The semiconductor device according to claim 1, wherein air is enclosed between the first main surface of the image sensor and the glass substrate.

8. The semiconductor device according to claim 1, wherein one or more types of insulating materials are inserted between the second main surface of the image sensor and the first wiring layer.

9. The semiconductor device according to claim 8, wherein an electrode unit on the second main surface of the image sensor and the first wiring layer are electrically connected via a metal bump.

10. The semiconductor device according to claim 8, wherein an electrode unit on the second main surface of the image sensor and the first wiring layer are electrically connected via a via.

11. The semiconductor device according to claim 1, further comprising a lens structure in which a plurality of lenses are stacked, wherein the semiconductor device is configured such that light concentrated by the plurality of lenses is incident on the image sensor.

12. A semiconductor device comprising:
an image sensor in which photoelectric conversion elements are formed on a semiconductor substrate;
a glass substrate that protects a first main surface that is a light-receiving surface of the image sensor, wherein the glass substrate is formed to be thicker in an outer peripheral portion than in an inside portion thereof; and
an insulating member that covers entire side surfaces of the image sensor and the glass substrate, wherein the insulating member is thinner in the outer peripheral portion where the glass substrate is thicker.

13. The semiconductor device according to claim 12, wherein a second main surface opposite to the first main surface of the image sensor is also covered with the insulating member.

14. A method for manufacturing a semiconductor device, the method comprising:
arranging a glass substrate on a first main surface of an image sensor in which photoelectric conversion elements are formed on a semiconductor substrate wherein the glass substrate is thicker in an outer peripheral portion than in an inside portion thereof;
forming a wiring layer that includes metal wiring extending from a plurality of electrode units inside a region of the image sensor to the outer peripheral portion of the image sensor on a second main surface opposite to the first main surface of the image sensor, wherein between the glass substrate and the wiring layer, side surfaces of the image sensor are covered with an insulating material, and wherein the insulating material is thinner in the outer peripheral portion where the glass substrate is thicker; and
forming external terminals to be connected to the metal wiring.

15. An electronic apparatus comprising
a semiconductor device, the semiconductor device comprising:
an image sensor in which photoelectric conversion elements are formed on a semiconductor substrate;
a glass substrate arranged on a first main surface of the image sensor wherein the glass substrate is thicker in an outer peripheral portion than in an inside portion thereof;
a wiring layer formed on a second main surface opposite to the first main surface of the image sensor, wherein between the glass substrate and the wiring layer, side surfaces of the image sensor are covered with an insulating material, and wherein the insulating material is thinner in the outer peripheral portion where the glass substrate is thicker; and
a plurality of external terminals,
wherein metal wiring of the wiring layer includes a plurality of electrode units formed in a region of the image sensor and a plurality of wiring elements, wherein each wiring element of the plurality of wiring elements extends between a respective electrode unit of the plurality of electrode units and a respective external terminal of the plurality of external terminals.

16. An electronic apparatus comprising:
a semiconductor device, the semiconductor device comprising:
an image sensor in which photoelectric conversion elements are formed on a semiconductor substrate;
a glass substrate that protects a light-receiving surface of the image sensor, wherein the glass substrate is formed to be thicker in an outer peripheral portion than in an inside portion thereof; and
an insulating member that covers entire side surfaces of the image sensor and the glass substrate, wherein the insulating member is thinner in the outer peripheral portion where the glass substrate is thicker.

* * * * *